(12) United States Patent
Ihara

(10) Patent No.: US 10,192,910 B2
(45) Date of Patent: Jan. 29, 2019

(54) IMAGE SENSOR

(71) Applicant: SAMSUNG ELECTRONICS CO., LTD., Suwon-si, Gyeonggi-Do (KR)

(72) Inventor: Hisanori Ihara, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/837,879

(22) Filed: Dec. 11, 2017

(65) Prior Publication Data
US 2018/0190694 A1   Jul. 5, 2018

(30) Foreign Application Priority Data
Dec. 29, 2016  (KR) .................... 10-2016-0182344

(51) Int. Cl.
*H01L 27/148*   (2006.01)
*H01L 27/146*   (2006.01)

(52) U.S. Cl.
CPC .... *H01L 27/14603* (2013.01); *H01L 27/1463* (2013.01); *H01L 27/14614* (2013.01); *H01L 27/14638* (2013.01); *H01L 27/14641* (2013.01)

(58) Field of Classification Search
USPC ............ 257/225, 219, 239, 240, 241, 246, 257/E27.082–E27.083, E27.15–E27.163, 257/E29.065, E29.227–E29.24, 228, 291, 257/432, 758; 438/60, 75, 144
See application file for complete search history.

(56) References Cited

U.S. PATENT DOCUMENTS

| | | |
|---|---|---|
| 8,278,614 B2 | 10/2012 | Han |
| 8,637,910 B2 | 1/2014 | Koo et al. |
| 8,716,769 B2 | 5/2014 | Ihara et al. |
| 8,823,070 B2 | 9/2014 | Hisanori |
| 8,956,908 B2 | 2/2015 | Hisanori |
| 8,987,751 B2 | 3/2015 | Ihara |
| 9,025,063 B2 | 5/2015 | Ahn et al. |
| 9,036,067 B2 | 5/2015 | Taura |
| 9,190,445 B2 | 11/2015 | Yamaguchi |
| 9,312,291 B2 | 4/2016 | Tatani et al. |
| 9,337,224 B2 | 5/2016 | Ihara |
| 2010/0176271 A1 | 7/2010 | Rim et al. |

(Continued)

FOREIGN PATENT DOCUMENTS

KR            0935048           12/2009

*Primary Examiner* — Tram H Nguyen
(74) *Attorney, Agent, or Firm* — Volentine, Whitt & Francos, PLLC

(57) ABSTRACT

An image sensor including first and second pixel regions adjacent to each other in a first direction in a light-receiving region that receives light and generates charges; a third pixel region adjacent to the first pixel region in a second direction intersecting the first direction in the light-receiving region; a first device isolation layer between the first and second pixel regions and between the first and third pixel regions to separate the first pixel region from the second pixel region and the first pixel region from the third pixel region; second device isolation layers in each of the first to third pixel regions to define active regions; a plurality of transfer gates and a plurality of logic gates on the active regions; and a side connection contact overlapping the first device isolation layer and connected to a side surface of an active region.

20 Claims, 19 Drawing Sheets

(56) References Cited

U.S. PATENT DOCUMENTS

| | | | |
|---|---|---|---|
| 2013/0307040 A1* | 11/2013 | Ahn | H01L 27/1463 257/292 |
| 2013/0320407 A1* | 12/2013 | Ahn | H01L 31/02 257/239 |
| 2015/0132882 A1 | 5/2015 | Hisanori | |
| 2016/0056198 A1* | 2/2016 | Lee | H01L 27/14612 257/225 |
| 2016/0126282 A1 | 5/2016 | Chen et al. | |
| 2016/0268321 A1 | 9/2016 | Ihara et al. | |
| 2017/0104021 A1* | 4/2017 | Park | H01L 27/14614 |
| 2017/0200759 A1* | 7/2017 | Ihara | H01L 27/1461 |

* cited by examiner

IMAGE SENSOR

CROSS-REFERENCE TO RELATED APPLICATION

A claim for priority under 35 U.S.C. § 119 is made to Korean Patent Application No. 10-2016-0182344, filed on Dec. 29, 2016, in the Korean Intellectual Property Office, the disclosure of which is incorporated herein in its entirety by reference.

BACKGROUND

The inventive concepts described herein relate to image sensors. More specifically, the inventive concepts relate to providing image sensors having improved performance by employing a side connection contact.

Image sensors are devices that convert an optical image into an electric signal. As computer and communications technologies have recently evolved, there has been increased demand for image sensors having improved performance for use in a variety of applications such as digital camera, camcorders, and personal communication systems (PCS) to name a few.

Image sensors typically include charge coupled devices (CCDs) or CMOS image sensors. Among these, CMOS image sensors are easy to drive, and may be incorporated along with corresponding signal processing circuits into a single chip, to provide a product of reduced size. Additionally, the power consumption of CMOS image sensors is low, making CMOS image sensors ideal for use in products with limited battery capacity. Furthermore, CMOS image sensors can be manufactured using CMOS process technology, thereby reducing manufacturing cost. Due to reduced size and manufacturing costs, the use of CMOS image sensors in products which require high resolution imaging has increased.

As the demand for highly integrated semiconductor devices has increased, the demand for improved image sensors has consequently increased. However, along with the increased use of improved image sensors, increased attention has been given to problems such as low conversion gain (CG) and image lag.

SUMMARY

Embodiments of the inventive concepts provide an image sensor with improved performance by employing a side connection contact.

Embodiments of the inventive concepts provide an image sensor including first and second pixel regions disposed adjacent to each other along a first direction in a light-receiving region, wherein the light-receiving region receives light and generates charges; a third pixel region disposed adjacent to the first pixel region along a second direction in the light-receiving region, the second direction intersecting the first direction; a first device isolation layer disposed between the first and second pixel regions and between the first and third pixel regions to separate the first pixel region from the second pixel region and the first pixel region from the third pixel region; second device isolation layers disposed in each of the first to third pixel regions to define active regions in each of the first to third active regions; a plurality of transfer gates and a plurality of logic gates disposed on the active regions; and a side connection contact overlapping the first device isolation layer and connected to a side surface of an active region from among the active regions.

Embodiments of the inventive concepts further provide an image sensor including a pixel region disposed in a light-receiving region and defined by a first device isolation layer, wherein the light-receiving region receives light and generates charges; a photoelectric conversion layer disposed in the pixel region; a well impurity layer disposed on the photoelectric conversion layer; a second device isolation layer defining active regions in the well impurity layer, wherein the active regions include a first active region and a second active region; a transfer gate disposed over the photoelectric conversion layer and adjacent to the first active region; and a side connection contact overlapping the first device isolation layer and connected to a side surface of the first active region or a side surface of the second active region.

Embodiments of the inventive concept still further provide a first pixel region having a first photoelectric conversion region disposed therein; a first device isolation layer surrounding the first pixel region; a second device isolation layer defining active regions in the first pixel region; and a first side connection contact that overlaps the first isolation layer, that extends through a part of the first device isolation layer, and that is connected to a side surface of a first active region from among the active regions.

BRIEF DESCRIPTION OF THE DRAWINGS

Exemplary embodiments of the inventive concepts will become more apparent and more clearly understood from the following detailed description taken in conjunction with the accompanying drawings, in which.

DETAILED DESCRIPTION

The inventive concepts will now be described more fully with reference to the accompanying drawings, in which exemplary embodiments of the inventive concepts are shown.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Hereinafter, an image sensor according to exemplary embodiments of the inventive concepts will be described with reference to FIGS. 1 to 5B.

Figure 1:
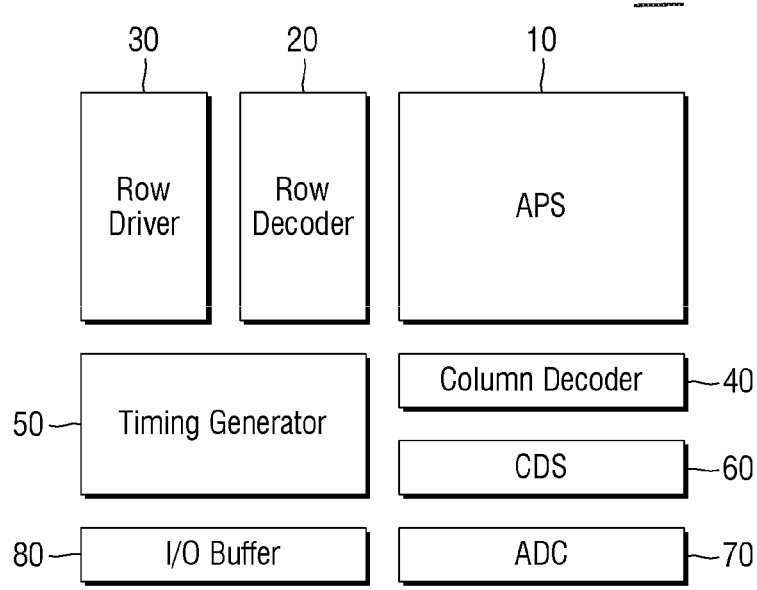
FIG. 1 illustrates a block diagram of an image sensor according to exemplary embodiments of the inventive concepts.

FIG. 1 illustrates a block diagram of an image sensor 1 according to exemplary embodiments of the inventive concepts.

Referring to FIG. 1, the image sensor includes an active pixel sensor array (APS) 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 includes a plurality of unit pixels arranged two-dimensionally, and converts an optical signal incident on the plurality of unit pixels into an electrical signal. The active pixel sensor array 10 may be driven by a plurality of driving signals such as a pixel selection signal, a reset signal, and a charge transfer signal (not shown in FIG. 1) from the row driver 30. In addition, an electrical signal converted by the active pixel sensor array 10 responsive to the optical signal is provided to the correlated double sampler 60.

The row driver 30 provides driving signals for driving the plurality of unit pixels, and the driving signals are provided to the active pixel sensor array 10 in response to decoding by the row decoder 20. When the unit pixels are arranged in a matrix, the driving signals may be provided row-by-row.

The timing generator 50 provides a timing signal and a control signal to the row decoder 20 and the column decoder 40.

The correlated double sampler (CDS) 60 receives an electrical signal generated in the active pixel sensor array 10, and is configured to hold and sample the generated electrical signal. The correlated double sampler 60 performs sampling by taking two samples of a certain noise level and the signal level of an electrical signal, and outputs a difference level corresponding to the difference between the noise level and the signal level.

The analog-to-digital converter (ADC) 70 converts the analog signal corresponding to the difference level output from the correlated double sampler 60 into a digital signal and outputs the digital signal.

The I/O buffer 80 latches digital signals output from the analog-to-digital converter 70, and sequentially outputs the latched digital signals to an image signal processing unit (not shown).

Figure 2:
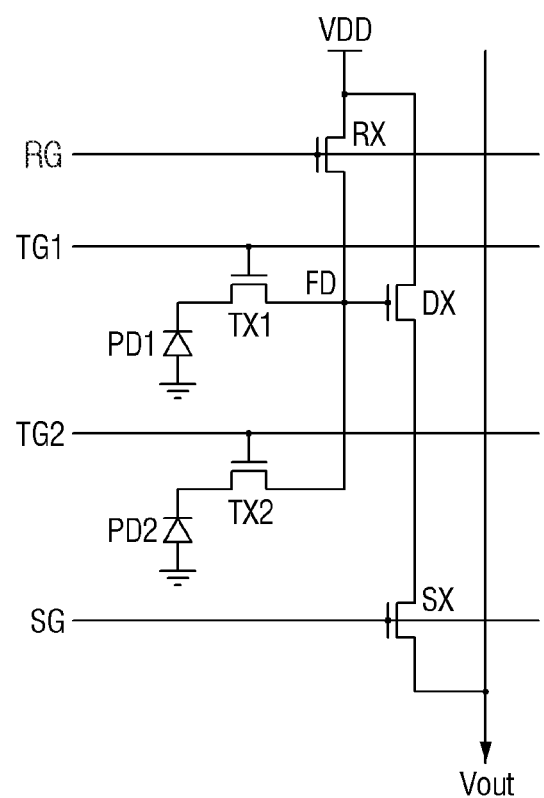
FIG. 2 illustrates a circuit diagram of a unit pixel of an image sensor according to exemplary embodiments of the inventive concepts.

FIG. 2 illustrates a circuit diagram of a unit pixel of an image sensor according to exemplary embodiments of the inventive concepts.

Referring to FIG. 2, the unit pixel includes for example first and second transfer transistors TX1 and TX2 and a plurality of logic transistors RX, SX, and DX. The plurality of logic transistors may include a reset transistor (RX), a selection transistor (SX), and a drive transistor or a source follower transistor (DX).

The first transfer transistor TX1 comprises a first transfer gate TG1 and a first photoelectric conversion unit PD1, and the second transfer transistor TX2 comprises a second transfer gate TG2 and a second photoelectric conversion unit PD2. The first and second transfer transistors TX1 and TX2 share a floating diffusion region FD.

The first and second photoelectric conversion units PD1 and PD2 may generate and accumulate photogenerated charges in proportion to the amount of light incident from the outside. Each of the first and second photoelectric conversion units PD1 and PD2 may be for example a photo diode, a photo transistor, a photo gate, a pinned photodiode (PPD) or a combination thereof, or the like.

The first and second charge transfer gates TG1 and TG2 transfer the charges accumulated in the first and second photoelectric conversion units PD1 and PD2 to the floating diffusion region FD, respectively. The signals applied to the first and second charge transfer gates TG1 and TG2 may be complementary to each other. That is, charges may be transferred from the first photoelectric conversion unit PD1 or the second photoelectric conversion unit PD2 to the floating diffusion region PD.

The floating diffusion region FD receives the charges generated in the first and second photoelectric conversion units PD1 and PD2 and stores them accumulatively. The drive transistor DX may be controlled according to the amount of the photogenerated charges accumulated in the floating diffusion region FD.

The reset transistor RX may periodically reset the charges accumulated in the floating diffusion region PD. The drain electrode of the reset transistor RX is connected to the floating diffusion region FD and the source electrode thereof is connected to a supply voltage terminal VDD.

The reset transistor RX includes a reset gate RG and may be controlled by a reset signal. Specifically, when the reset transistor RX is turned on by the reset signal, the supply voltage VDD connected to the source electrode of the reset transistor RX is transferred to the floating diffusion region FD. Accordingly, when the reset transistor RX is turned on, the charges accumulated in the floating diffusion region FD are discharged, so that the floating diffusion region FD may be reset.

The drive transistor DX serves as a source follower buffer amplifier in cooperation with a constant current source (not shown) located outside the unit pixel. The drive transistor amplifies the potential change in the floating diffusion region FD and outputs the amplified potential change to a line Vout.

The selection transistor SX may select a unit pixel to be read row-by-row. The selection transistor SX includes a selection gate SG and may be driven by a row selection signal. Specifically, when the selection transistor SX is turned on by the row selection signal, the supply voltage VDD connected to the drain electrode of the drive transistor DX may be transferred to the drain electrode of the selection transistor SX.

Figure 3:
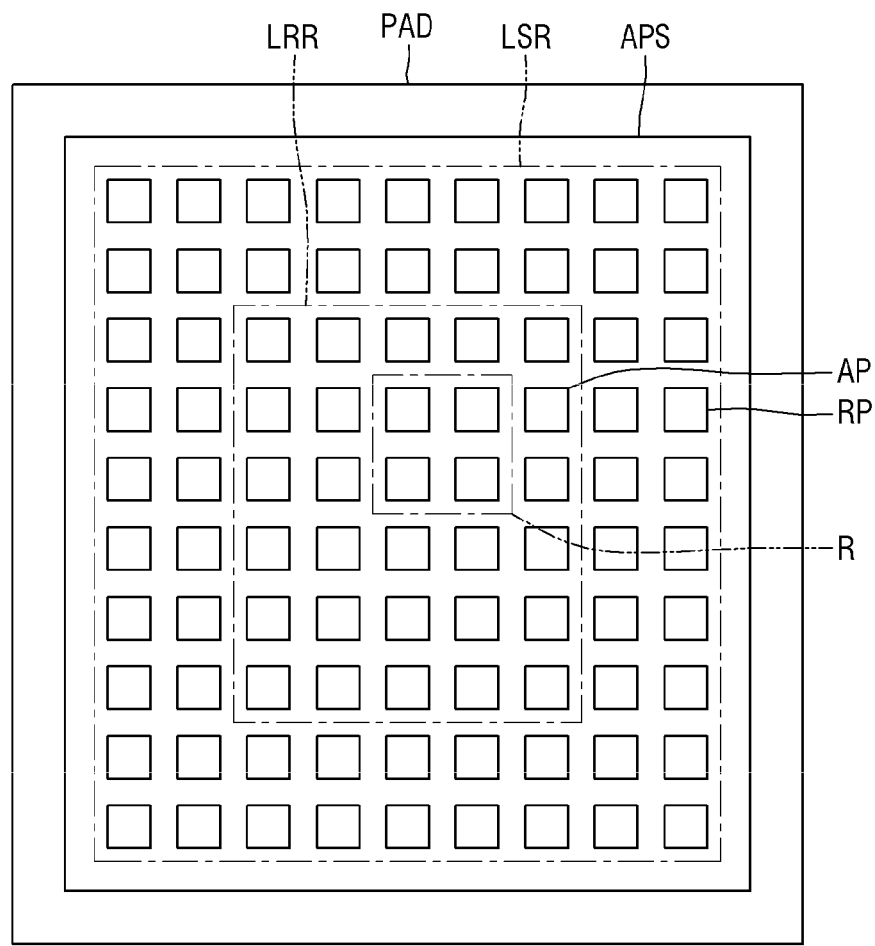
FIG. 3 illustrates a view of an image sensor according to exemplary embodiments of the inventive concepts.

FIG. 3 illustrates a view of an image sensor according to exemplary embodiments of the inventive concepts.

Referring to FIG. 3, an image sensor according to some exemplary embodiments includes an active pixel sensor array area APS and a pad area PAD.

The active pixel sensor array area in which unit pixels are arranged may include a light-receiving region LRR receiving light to generate charges, and a light-shielding region LSR not receiving light. In some embodiments of the inventive concepts, the light-shielding region LSR may be disposed between the light-receiving region LRR and the pad area PAD. However, arrangement is not limited as described with respect to FIG. 3, and in other embodiments of the inventive concepts the light-receiving region LRR and the light-shielding region LSR may be arranged in various ways.

A plurality of unit pixels arranged in a matrix is disposed in the active pixel sensor array area APS. In addition, in the active pixel sensor array area APS, an electric signal generated responsive to an incident light is output.

Specifically, the unit pixels may include active pixels AP and reference pixels RP. The active pixels AP are disposed in the light-receiving region LRR, and may convert the incident light into electrical signals. The reference pixels RP are disposed in the light-shielding region LSR and may output electrical signals generated in unit pixels that do not have light incident thereon.

The pad area PAD includes a conductive pad used for inputting/outputting a control signal and a photoelectric signal from the active pixel sensor array area APS. The pad area PAD may be disposed around the active pixel sensor array area APS so that external elements can be easily connected thereto. That is, the pad area PAD may be disposed at the edge portion of the image sensor.

Figure 4A:
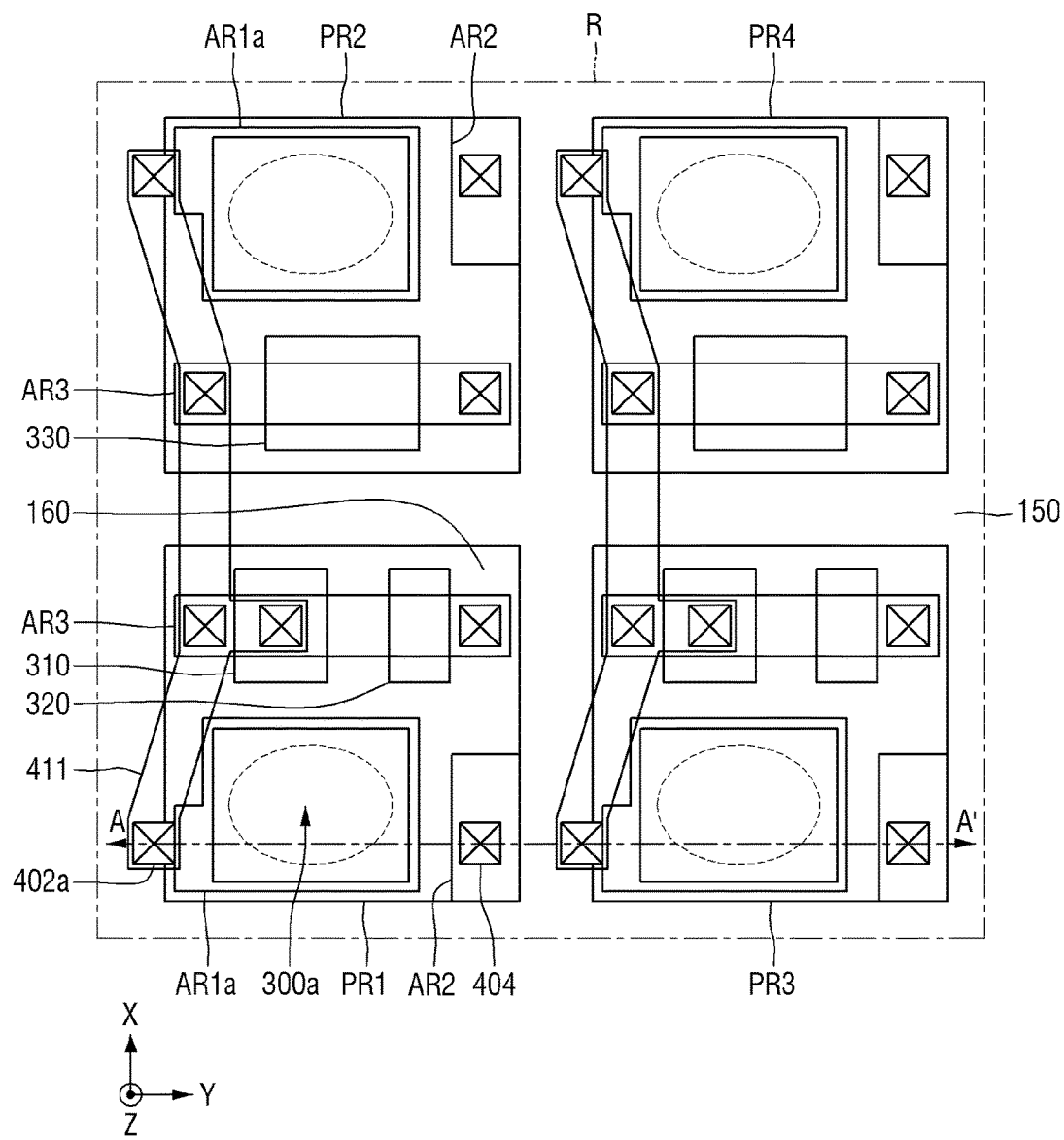
FIG. 4A illustrates an enlarged view of the region R of FIG. 3.
Figure 4B:
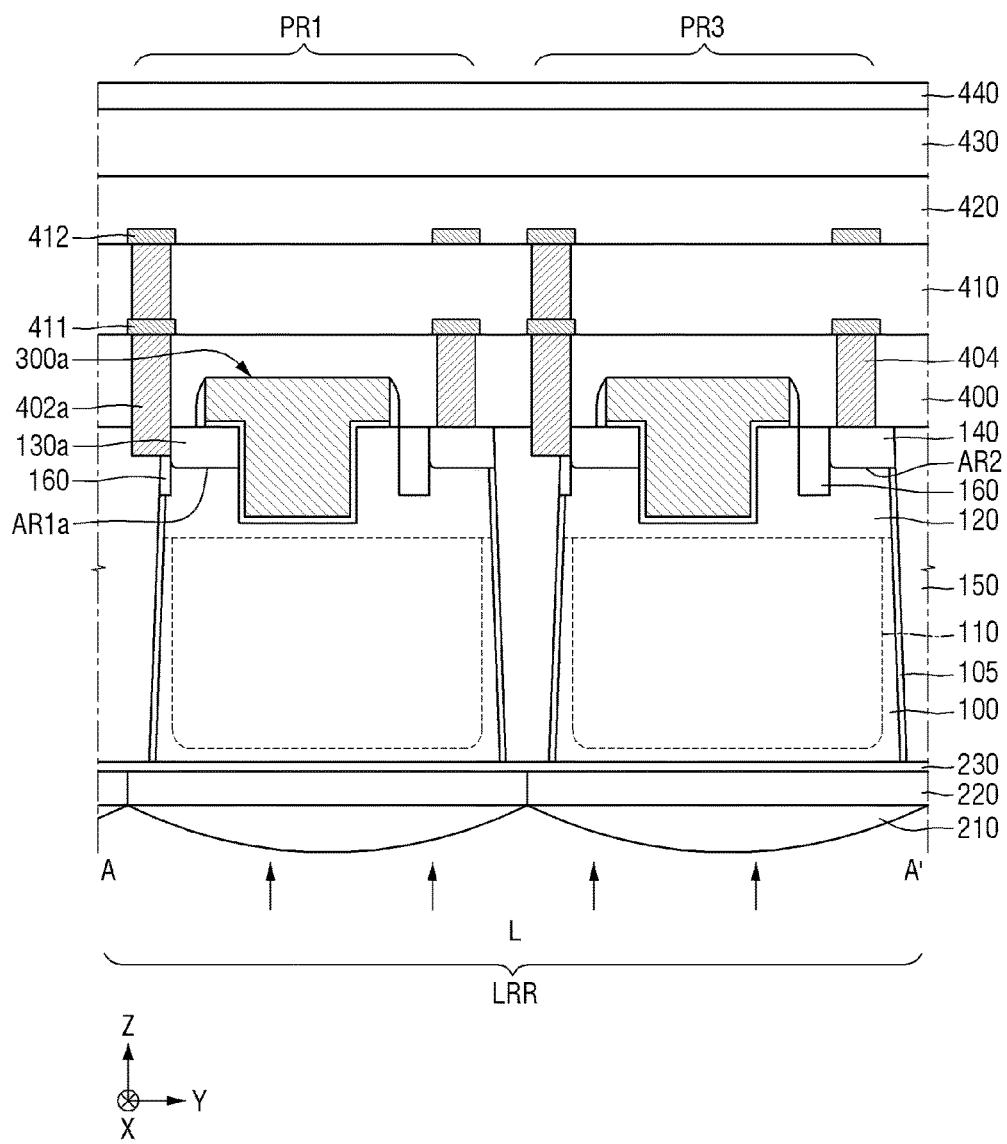
FIG. 4B illustrates a cross-sectional view taken along line A-A' of FIG. 4A.

FIG. 4A illustrates an enlarged view of the region R of FIG. 3. FIG. 4B illustrates a cross-sectional view taken along line A-A' of FIG. 4A.

Referring to FIGS. 4A and 4B, the image sensor includes first to fourth pixel regions PR1 to PR4 (i.e., PR1, PR2, PR3 and PR4), a first device isolation layer 150, a side connection contact 402a, and a ground region contact 404.

In each of the first to fourth pixel regions PR1 to PR4, first to third active regions AR1a, AR2 and AR3, a second device isolation layer 160, a transfer gate 300a, and a plurality of logic gates 310, 320 and 330 may be disposed. The plurality of logic gates 310, 320 and 330 may respectively include a source follower gate, a selection gate, and a reset gate. Hereinafter, the plurality of logic gates 310, 320 and 330 may in the alternative be respectively referred to as a source follower gate 310, a selection gate 320 and a reset gate 330.

As described above with reference to FIG. 3, the first to fourth pixel regions PR1 to PR4 may be disposed in the light-receiving region LRR that receives light L to generate charges.

Specifically, the first and second pixel regions PR1 and PR2 may be disposed adjacent to each other in (or along) a first direction X, while the first and third pixel regions PR1 and PR3 may be disposed adjacent to each other in (or along) a second direction Y intersecting the first direction X. The second direction Y may be characterized as orthogonal with respect to the first direction X. The fourth pixel region PR4 may be disposed adjacent to the second pixel region PR2 in the second direction Y and may be disposed adjacent to the third pixel region PR3 in the first direction X.

The first to fourth pixel regions PR1 to PR4 may be defined by the first device isolation layer 150 in the light-receiving region LRR. That is, the first device isolating layer 150 surrounds the first to fourth pixel regions PR1 to PR4 in the light-receiving region LRR and extends in (or along) a third direction Z to separate the first to fourth pixel regions PR1 to PR4 from one another. The third direction Z may for example be characterized as a vertical direction, while the first direction X and the second direction Y may be characterized as horizontal directions.

Specifically, the first device isolation layer 150 is disposed between the first and second pixel regions PR1 and PR2, between the first and third pixel regions PR1 and PR3, between the second and fourth pixel regions PR2 And PR4 and between the third and fourth pixel regions PR3 and PR4, to separate the first to fourth pixel regions PR1 to PR4 from one another.

In some embodiments of the inventive concept, the first and second pixel regions PR1 and PR2 may form a unit pixel according to the circuit diagram of FIG. 3, and the third and fourth pixel regions PR3 and PR4 also may form a unit pixel according to the circuit diagram of FIG. 3. That is, the third pixel region PR3 may be identical to the first pixel region PR1, and the fourth pixel region PR4 may be identical to the second pixel region PR2. In the following with respect to FIGS. 4A and 4B, to avoid redundancy and for convenience of illustration, description and reference characters of corresponding same features in the respective first to fourth pixel regions PR1 to PR4 may be omitted.

The second device isolation layer 160 may be disposed in each of the first to fourth pixel regions PR1 to PR4 to define the first to third active regions AR1a, AR2 and AR3.

The transfer gate 300a may be disposed adjacent to the first active region AR1a of the first pixel region PR1. In addition, the source follower gate 310 and the selection gate 320 may be disposed on the third active region AR3 of the first pixel region PR1, and the reset gate 330 may be disposed on the third active region AR3 of the second pixel region PR2. However, arrangement is not limited as described with respect to FIGS. 4A and 4B, and in other embodiments of the inventive concepts, the transfer gate 300a and the plurality of logic gates 310, 320 and 330 may be disposed in various ways.

In addition, each of the first to fourth pixel regions PR1 to PR4 includes a side connection contact 402a and a ground region contact 404. So as to simplify the drawings and for convenience of illustration, only the side connection contact 402a and the ground region contact 404 in first pixel region PR1 are denoted by reference characters. The side connection contact 402a may be connected to the first active region AR1a of each of the first to fourth pixel regions PR1 to PR4, and the ground region contact 404 may be connected to the second active region AR2 of each of the first to fourth pixel regions PR1 to PR4. However, the arrangement is not limited as described with respect to FIGS. 4A and 4B, and in other embodiments of the inventive concepts, the side connection contact 402a and the ground region contact 404 may for example be connected to other active regions.

As shown in FIG. 4B, the image sensor includes a microlens 210, a color filter layer 220, a protective planarization layer 230, a photoelectric conversion layer 110, a well impurity layer 120, a second device isolation layer 160, a transfer gate 300a, a potential barrier layer 105, first and second active regions AR1a and AR2, a first interlayer insulating layer 400, a side connection contact 402a, and a ground region contact 404 disposed in each of the first to fourth pixel regions PR1 to PR4.

The microlens 210 has a convex shape and may have a predetermined radius of curvature. The microlens 210 may be formed of a light-transmitting resin and may condense the light L into the respective first to fourth pixel regions PR1 to PR4.

The color filter layer 220 may include a red, green or blue color filter depending on the unit pixel. The color filter layer 220 may be arranged two-dimensionally and may include a yellow filter, a magenta filter, and a cyan filter. Further, the color filter layer 220 may further include a white filter.

The protective planarization layer 230 may be an impurity layer at a high concentration and may be doped with p-type impurities such as boron (B). However, the protective planarization layer 230 is not limited as described above, and may for example be formed of an oxide layer having negative charges, among other materials.

The protective planarization layer 230 can prevent occurrence of a dangling-bond defect of silicon, a surface defect caused by etching stress, or a depletion well when electric potential is decreased at a surface adjacent to the substrate 100 due to an interface trap. Also, the protective planarization layer 230 may provide a potential gradient so that the photogenerated charges in the portion adjacent to the substrate 100 can flow into the floating diffusion region 130a.

The photoelectric conversion layer 110 may be formed on the substrate 100. The substrate 100 may be for example a bulk silicon substrate, an SOI (silicon on insulator) substrate, or a semiconductor epitaxial layer, and may be other substrates or layers.

The photoelectric conversion layer 110 generates photogenerated charges in proportion to the intensity of the light L. For example, the photoelectric conversion layer 110 may be a photodiode.

The photoelectric conversion layer 110 may be formed by doping the substrate 100 with impurities of a conductivity type opposite to that of the substrate 100. For example, the photoelectric conversion layer 110 may be formed by ion implantation of n-type impurities. In addition, the photoelectric conversion layer 110 may be provided so that there may be a difference in impurity concentration at an upper portion and a lower portion thereof, so that there a potential gradient is provided in the photoelectric conversion layer 110 along the third direction Z. For example, the photoelectric conversion layer 110 may be formed by stacking a plurality of impurity regions.

The well impurity layer 120 may be disposed on the photoelectric conversion layer 110. The well impurity layer 120 may be formed by doping the substrate 100 with impurities of a conductivity type opposite to that of the photoelectric conversion layer 110. For example, the well impurity layer 120 may be formed by ion implantation of p-type impurities.

As described above, the first device isolation layer 150 may surround the pixel regions in the light-receiving region LRR and may extend in the third direction Z to separate the pixel regions from one another. For example, the first device isolation layer 150 may separate the first and third pixel regions PR1 and PR3 from each other.

Specifically, the first device isolation layer 150 may be formed by patterning the substrate 100 to form a deep trench, and then filling the deep trench with an insulative material. Accordingly, the first device isolation layer 150 may extend from the upper surface of the substrate 100 to the lower surface of the substrate 100 in the third direction Z. In some patterning processes, the first device isolation layer 150 may have a shape in which a width of the upper surface in the second direction Y is larger than a width of the lower surface in the second direction Y thereof.

The first device isolation layer 150 may be formed of an insulative material having a lower refractive index than that of the substrate 100. For example, when the substrate 100 is formed of silicon, the first device isolation layer 150 may for example be formed of a silicon oxide layer, a silicon nitride layer, an undoped polysilicon layer, air, or a combination thereof.

Accordingly, the first device isolation layer 150 can refract light obliquely incident on the photoelectric conversion layer 110. As a result, the efficiency of receiving light by the photoelectric conversion layer 110 can be improved such that the image quality of the charges can be improved.

Also, the first device isolation layer 150 can prevent photogenerated charges generated by the light L in a pixel region from moving to an adjacent pixel region by random drift. For example, the first device isolation layer 150 can prevent photogenerated charges generated in the first pixel region PR1 from moving to the third pixel region PR3. Accordingly, the color reproducibility of the charges can be improved.

As described above, the second device isolation layer 160 may be disposed in each of the pixel regions to define the active regions. For example, the second device isolation layer 160 may be formed in the well impurity layer 120 to define a region of the well impurity layer 120 in which the second device isolation layer 160 is not formed, as an active region.

Specifically, the second device isolation layer 160 may be formed by patterning the substrate 100 to form a shallow trench, and then filling the shallow trench with an insulative material. In some embodiments of the inventive concepts, the second device isolation layer 160 may be an impurity region having the same conductivity type as that of the well impurity layer 120. In this case, the impurity concentration at the second device isolation layer 160 may be higher than the impurity concentration at the well impurity layer 120.

The depth of the second device isolation layer 160 in the third direction Z may be shallower than the depth of the first device isolation layer 150 in the third direction Z. That is, the upper surface of the second device isolation layer 160 may exist in substantially a same plane with the upper surface of the first device isolation layer 150. However, the lower surface of the second device isolation layer 160 may be located at a higher position than the lower surface of the first device isolation layer 150. In addition, the second device isolation layer 160 may be spaced apart from the photoelectric conversion layer 110.

The transfer gate 300a is disposed on (or over) the photoelectric conversion layer 110 and may be disposed adjacent to the first active region AR1a. Specifically, the transfer gate 300a may be disposed adjacent to the first active region AR1a defined by the second device isolation layer 160 in the well impurity layer 120 on the photoelectric conversion layer 110.

In some embodiments of the inventive concepts, the transfer gate 300a may include a lower portion that is inserted into the substrate 100 and an upper portion that protrudes from the upper surface of the substrate 100. Specifically, the transfer gate 300a may be formed by forming a trench in the first active region AR1a formed in the well impurity layer 120 on the photoelectric conversion layer 110, forming a gate insulating layer and a gate conductive layer sequentially in the trench, and forming gate spacers on the side walls of the gate conductive layer. Accordingly, the lower portion of the transfer gate 300a may penetrate through a part of the well impurity layer 120 to be buried in the well impurity layer 120, and the upper portion of the transfer gate 300a may be connected to the lower portion and may have an upper surface higher than the upper surface of the substrate 100. Also, a lowest surface (i.e., a bottom surface) of the transfer gate 300a may be lower than a lower surface (i.e., bottom surface) of the first active region AR1.

The potential barrier layer 105 may be disposed on a sidewall of the first device isolation layer 150. Specifically, the potential barrier layer 105 may be conformally formed on the sidewalls of the first device isolation layer 150, and may be disposed under the second device isolation layer 160 or the active region.

The potential barrier layer 105 may have a conductivity type opposite to that of the photoelectric conversion layer 110. For example, the potential barrier layer 105 may be formed by ion implantation of p-type impurities. Accordingly, the potential barrier layer 105 can suppress dark current. Specifically, when forming the first device isolation layer 150 in the deep trench formed by patterning the substrate 100, the potential barrier layer 105 can suppress dark current occurring due to electron-hole pairs (EHP) generated by a surface defect of the deep trench.

The first active region AR1a may include a floating diffusion region 130a disposed on one side of the transfer gate 300a. The floating diffusion region 130a may be disposed on one side of the transfer gate 300a so that it is close to the first device isolation layer 150 in the first active region AR1a.

The floating diffusion region 130a may be formed by doping impurities of a conductivity type opposite to that of the well impurity layer 120. For example, the floating diffusion region 130a may be formed by ion implantation of n-type impurities. Accordingly, the transfer gate 300a may transfer the charges generated in the photoelectric conversion layer 110 to the floating diffusion region 130a.

The first interlayer insulating layer 400 may be formed on the substrate 100 to cover the first device isolation layer 150, the transfer gate 300a, and the substrate 100. In addition, the upper surface of the first interlayer insulating layer 400 may be flat.

The first interlayer insulating layer 400 may be formed of an insulative material. For example, the first interlayer insulating layer 400 may be formed of, but is not limited to, HDP (High Density Plasma), TOSZ (Tonen SilaZene), SOG (Spin On Glass), USG (Undoped Silica Glass).

The side connection contact 402a overlaps with the first device isolation layer 150 and may be connected to the side surface of the first active region AR1a. That is, the side connection contact 402a may penetrate through a part of the first interlayer insulating layer 400 and the first device isolation layer 150 so as to be connected to the side surface (i.e., a sidewall) of the first active region AR1a. In other words, the side connection contact 402a has a side surface that extends substantially in the third direction Z and the first active region AR1a has a side surface that extends substantially in the third direction Z. A part of the side surface of the side connection contact 402a is connected to a part of the side surface of the first active region AR1a. Accordingly, the lower surface of the side connection contact 402a may be lower than the upper surface of the first device isolation layer 150 and the upper surface of the first active region AR1a, and the upper surface of the side connection contact 402a may be higher than the upper surface of the first device isolation layer 150 and the upper surface of the first active region AR1a.

Specifically, the side connection contact 402a may be formed by patterning the first interlayer insulating layer 400 and the first device isolation layer 150 to form a trench such that the side surface of the first active region AR1a is exposed, and filling the trench with a conductive material. The conductive material may include, but is not limited to, copper (Cu), aluminum (Al), tungsten (W), titanium (Ti), molybdenum (Mo), tantalum (Ta), a titanium nitride (TiN) layer, a tantalum nitride (TaN) layer, a zirconium nitride (ZrN) layer, a tungsten nitride (TiN) layer, and an alloy of the aforementioned materials/layers. Accordingly, the side connection contact 402a may extend from the upper surface of the first interlayer insulating layer 400 in the third direction Z to be connected to the side surface of the first active region AR1a.

When the second device isolation layer 160 is interposed between the first device isolation layer 150 and an active region, e.g., the first active region AR1a as shown in the drawings, the side connection contact 402a may be disposed on the second device isolation layer 160.

Specifically, the first interlayer insulating layer 400, the first device isolation layer 150 and the second device isolating layer 160 may be patterned to form a trench, and then the trench may be filled with a conductive material. Accordingly, the lower surface of the side connection contact 402a may be disposed on the second device isolation layer 160 and may be spaced apart from the potential barrier layer 105.

In some embodiments of the inventive concept, the side connection contact 402a may overlap with the first device isolation layer 150, and may be connected to the side surface of the floating diffusion region 130a disposed adjacent to the first device isolation layer 150 in the first active region AR1a. That is, the side connection contact 402a may be electrically connected to the floating diffusion region 130a to connect the floating diffusion region 130a with other elements of the image sensor.

For example, as shown in FIGS. 4A and 4B, the side connection contact 402a may connect the floating diffusion region 130a with the drain region of the reset transistor. Specifically, the floating diffusion region 130a may be connected to the third active region AR3 of the second pixel region PR2 in which the reset gate 330 is disposed via the side connection contact 402a and a line 411.

In addition, the side connection contact 402a may connect the floating diffusion region 130a with the gate portion of the drive transistor. Specifically, the floating diffusion region 130a may be connected to the source follower gate 310 via the side connection contact 402a and the line 411.

However, the arrangement is not limited as described with respect to FIGS. 4A and 4B, and in other embodiments of the inventive concepts the side connection contact 402a may for example be connected to other active regions according to a plurality of transfer gates and logic gates arranged in various ways.

The second active region AR2 may include a ground region 140 disposed on the opposite side of the transfer gate 300a. That is, the ground region 140 may be formed in the second active region AR2 and spaced apart from the floating diffusion region 130a. The ground region 140 may be connected to the first device isolation layer 150 as shown in FIG. 4B. However, the arrangement is not limited as described with respect to FIGS. 4A and 4B, and in other embodiments of the inventive concepts the second device isolation layer 160 may for example be interposed between the ground region 140 and the first device isolation layer 150.

The ground region 140 may be formed by doping impurities that have a conductivity type opposite to that of the floating diffusion region 130a and the same conductivity type as that of the well impurity layer 120. The ground region 140 may be doped at a higher concentration than the well impurity layer 120. For example, the floating diffusion region 130a may be formed by ion implantation of p-type impurities at a high concentration.

The ground region contact 404 may be disposed on the ground region 140 and may be electrically connected to the ground region 140. The ground region contact 404 may be formed of the same material as the side connection contact 402a, but is not limited thereto. Accordingly, the ground voltage can be transmitted (or connected) to the pixel region via the ground region contact 404 and the ground region 140.

Various types of wiring structures may be disposed on or over the first interlayer insulating layer 400. The wiring structure may transmit a plurality of driving signals such as a pixel selection signal, a reset signal, and a charge transfer signal for operation of the image sensor, and may connect the transfer transistor and the plurality of logic transistors which may be arranged in various ways.

As shown in FIG. 4B, the second interlayer insulating layer 410 and the line 411 may be disposed on the first interlayer insulating layer 400. That is, the line 411 electrically connected to the side connection contact 402a may be formed on the first interlayer insulating layer 400. As described above, the line 411 may be connected to the side connection contact of the second pixel region PR2, and the side connection contact of each of the first and second pixel regions PR1 and PR2 may be connected to the third active region AR3 or the source follower gate 310.

The second interlayer insulating layer 410 may be formed of the same material as the first interlayer insulating layer 400, and the line 411 may be formed of the same material as the side connection contact 402a. However, the materials of the second interlayer insulating layer 410 and the first interlayer insulating layer 400, and the materials of line 411 and the side connection contact 402a are not limited as described above. Accordingly, the source follower gate 310 can constitute a drive transistor that amplifies a potential change in the floating diffusion region 130a of the first and second active regions AR1a and AR2 and outputs the amplified potential change to an output line.

An additional interlayer insulating layer such as third and fourth interlayer insulating layers 420 and 430 may be formed on the first and second interlayer insulating layers 400 and 410, depending on the method of designing the unit pixel. In addition, additional contacts may be formed through the second interlayer insulating layer 410, and lines such as line 412 may be formed on the second, third and fourth interlayer insulating layers 410, 420 and 430.

Further, a passivation layer 440 may be formed on the uppermost interlayer insulating layer, e.g., the fourth interlayer insulating layer 430. The passivation layer 440 may be attached to a support substrate (not shown) for supporting the image sensor.

Figure 5A:
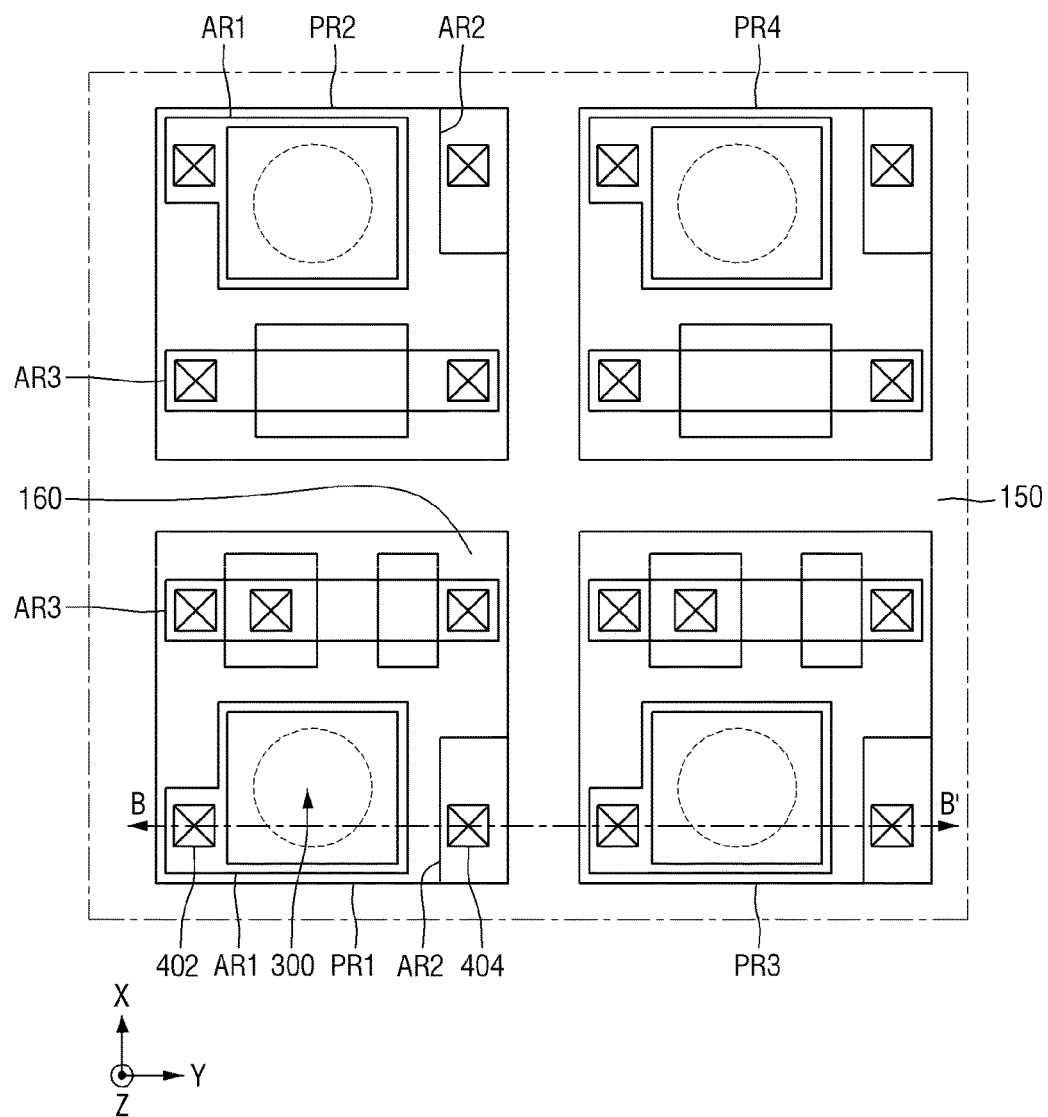
FIG. 5A illustrates a plan view providing explanation of effects of the image sensor of FIG. 4.
Figure 5B:
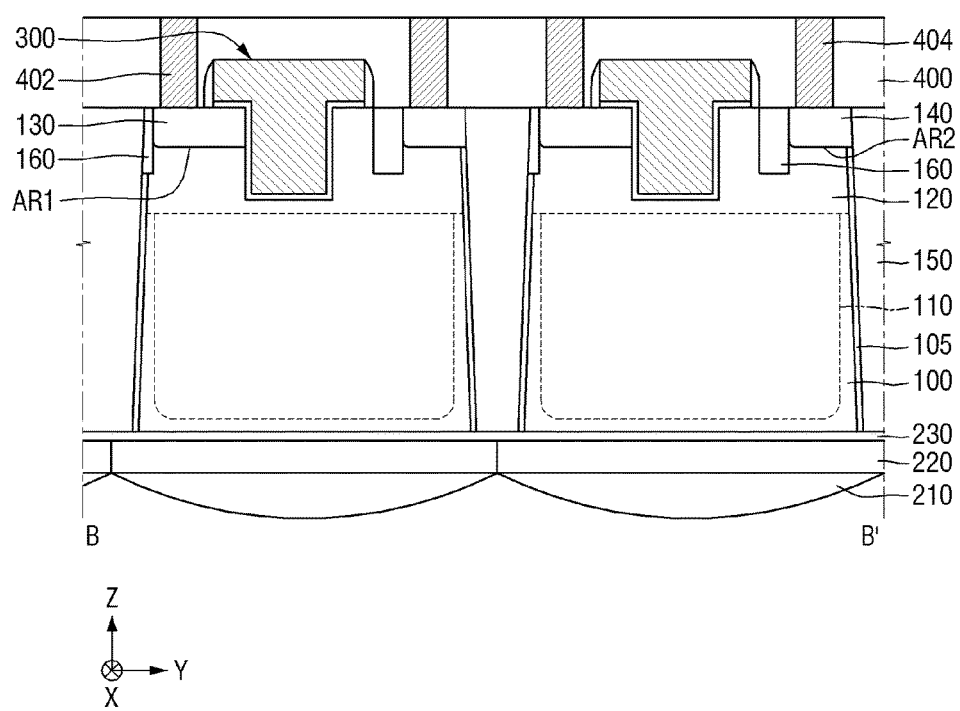
FIG. 5B illustrates a cross-sectional view taken along line B-B' of FIG. 5A.

FIG. 5A illustrates a plan view providing explanation of the image sensor of FIGS. 4A and 4B. FIG. 5B illustrates a cross-sectional view taken along line B-B' of FIG. 5A.

Redundant descriptions of identical functions and elements described above with reference to FIGS. 1 to 4B will be omitted for convenience of illustration. In addition, for convenience of illustration, the wiring structure including the second interlayer insulating layer 410, line 411, and other elements and/or structure above the first interlayer insulating layer 400 as shown in FIG. 4B will not be described with respect to FIGS. 5A and 5B.

Referring to FIGS. 4A to 5B, the image sensor according to FIGS. 5A and 5B includes a floating diffusion region contact 402. The floating diffusion region contact 402 is a counterpart corresponding to the side connection contact 402a in FIGS. 4A and 4B. In addition, a first active region AR1, a transfer gate 300 and a floating diffusion region 130 in FIGS. 5A and 5B are counterparts corresponding respectively to the first active region AR1a, the transfer gate 300a, and the floating diffusion region 130a in FIGS. 4A and 4B.

The floating diffusion region contact 402 is formed on the first active region AR1, in contrast to the side connection contact 402a. Specifically, unlike the side connection contact 402a, the floating diffusion region contact 402 is formed on the first active region AR1 to be connected to the first active region AR1, without overlapping with the first device isolation layer 150.

In this case in FIGS. 5A and 5B, space for forming the floating diffusion region contact 402 is reserved in the floating diffusion region 130 formed in the first active region AR1. In addition, the floating diffusion region contact 402 should be electrically isolated from the transfer gate 300. Accordingly, the area of the floating diffusion region 130 in FIGS. 5A and 5B may consequently be larger than the area of the floating diffusion region 130a formed in the first active region AR1a in FIGS. 4A and 4B.

In an image sensor, a floating diffusion region having large area deteriorates the conversion gain (CG) to thereby lower the signal-to-noise ratio (SNR). The floating diffusion region receives charges generated in the photoelectric conversion unit and accumulatively stores the charges. The drive transistor may be controlled using a voltage change according to the amount of charges accumulated in the floating diffusion region. If the floating diffusion region has large area, the electric capacity of the floating diffusion region is increased and deteriorates the conversion gain. Conversion gain is the efficiency at which the charges generated from the photoelectric conversion unit are converted into voltage change, and deteriorated conversion gain results in lower signal-to-noise ratio.

In view of the above, in the image sensor according to some exemplary embodiments of the inventive concepts, the area of the floating diffusion region is reduced by using the side connection contact 402a overlapping with the first device isolation layer 150, such that the conversion gain and the signal-to-noise ratio of the image sensor can be improved.

In addition, since the floating diffusion region contact 402 is formed in the first active region AR1 in FIGS. 5A and 5B, the transfer gate 300 formed adjacent to the floating diffusion region contact 402 may be smaller than the transfer gate 300a formed adjacent to the side connection contact 402a in FIGS. 4A and 4B.

In this regard, if a transfer gate in an image sensor has small size, problems arise such as image lag. Such problems may become serious as the image sensor becomes highly integrated.

Accordingly, the image sensor according to some exemplary embodiments of the inventive concepts includes the transfer gate 300A having comparatively increased size as a result of using the side connection contact 402a overlapping with the first device isolation layer 150, to thereby address problems such as image lag.

In addition, the side connection contact 402a as shown in FIGS. 4A and 4B provides a pixel having a pixel region of wider space than the pixel region including the floating diffusion region contact 402 such as shown in FIGS. 5A and 5B.

As image sensors become highly integrated, there is a need for a scheme to efficiently utilize pixel regions in limited space. In this regard, the side connection contact 402a provides wider space in the pixel regions to thereby provide a scheme for efficiently utilizing the pixel regions in limited space.

For example, the side connection contact 402a may be used to provide wider space in the pixel regions, thereby enabling the source follower gate to have larger size. A source follower gate having larger size can reduce random telegraph noise (RTN) in the image sensor.

As a result, the image sensor according to some exemplary embodiments of the inventive concepts has improved performance by using the side connection contact 402a overlapping with the first device isolation layer 150.

Hereinafter, an image sensor according to some exemplary embodiments of the inventive concepts will be described with reference to FIGS. 1 to 6B. Redundant descriptions of identical functions and elements described above with reference to FIGS. 1 to 5B will be omitted for convenience of illustration.

Figure 6A:
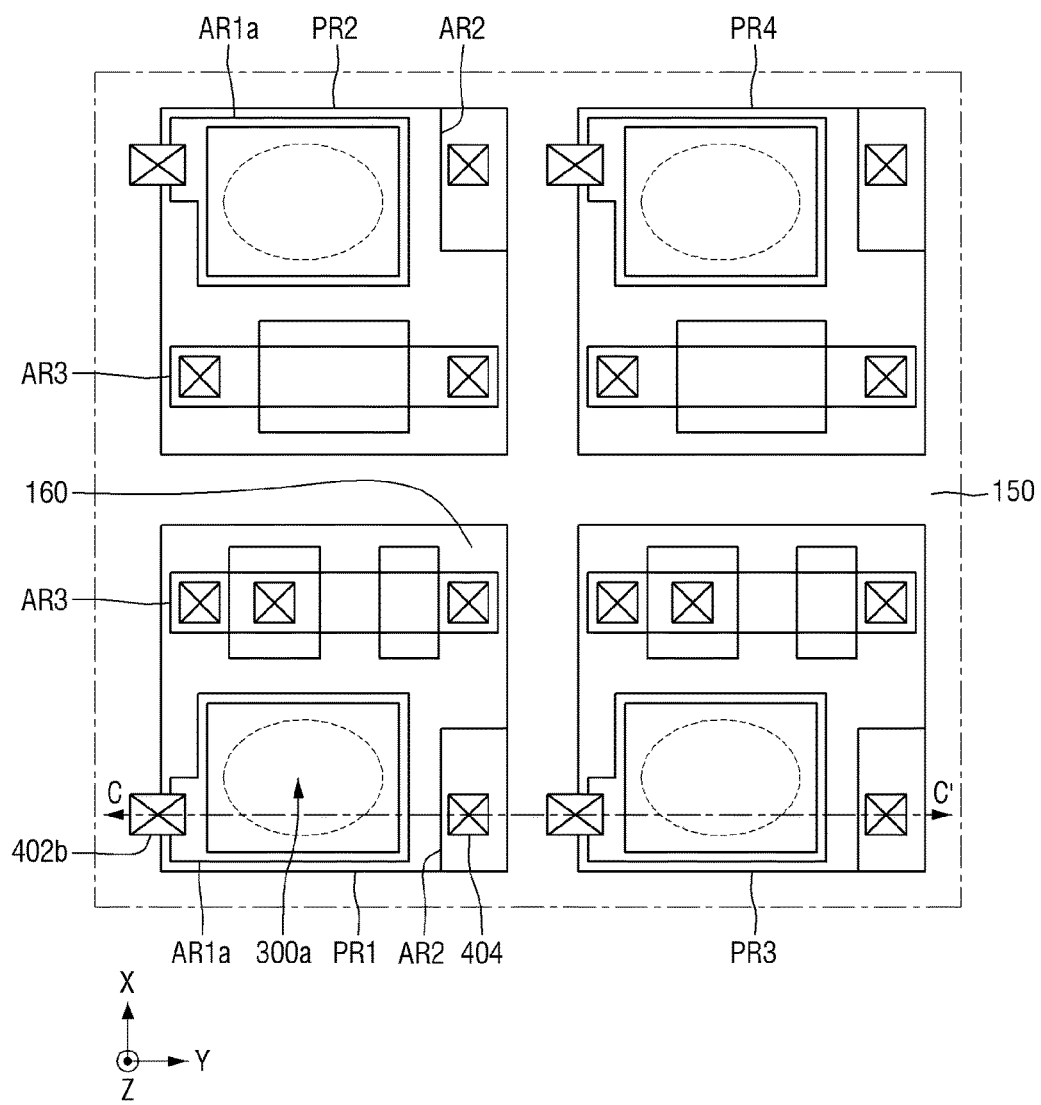
FIG. 6A illustrates a plan view of an image sensor according to exemplary embodiments of the inventive concepts.
Figure 6B:
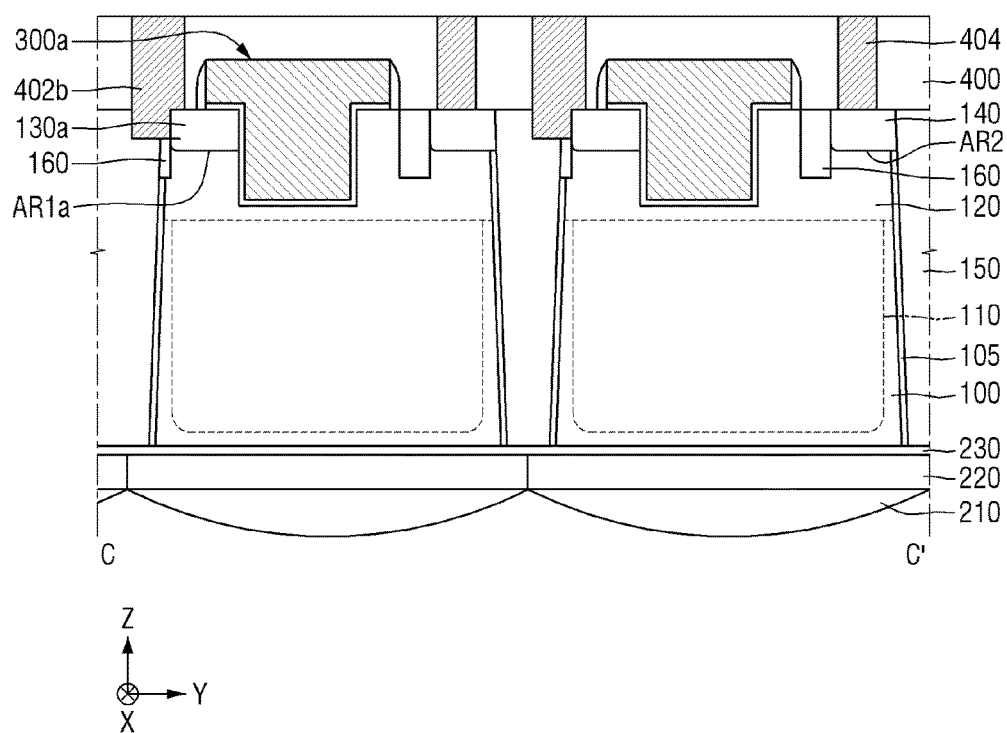
FIG. 6B illustrates a cross-sectional view taken along line C-C' of FIG. 6A.

FIG. 6A illustrates a plan view of an image sensor according to some exemplary embodiments of the inventive concepts. FIG. 6B illustrates a cross-sectional view taken along line C-C' of FIG. 6A.

Referring to FIGS. 4A, 4B, 6A and 6B, an image sensor according to some exemplary embodiments of the inventive concepts includes a side connection contact 402b. The side connection contact 402b is a counterpart corresponding to the side connection contact 402a in FIGS. 4A and 4B.

The side connection contact 402a in FIGS. 4A and 4B overlaps with the first device isolation layer 150 and is connected to the side surface of the first active region AR1a. The side connection contact 402b in FIGS. 6A and 6B overlaps the first active region AR1a and may also be connected to the upper surface (i.e., a top surface) of the first active region AR1a. Accordingly, the side connection contact 402b may have a first lower surface lower than the upper surface of the first active region AR1a and a second lower surface connected to the upper surface of the first active region AR1a.

Specifically, the side connection contact 402b in FIGS. 6A and 6B may be formed by patterning the first interlayer insulating layer 400 and the first device isolation layer 150 to form a trench such that the side surface and the upper surface of the first active region AR1a are exposed, and filling the trench with a conductive material. Accordingly, the side connection contact 402b may extend from the upper surface of the first interlayer insulating layer 400 in the third direction Z to be connected to the side surface and the upper surface of the first active region AR1a.

More specifically, the trenches may be formed by using an etch process having a higher etch selectivity with respect to the first device isolation layer 150 than to the first active region AR1a. For example, when the first interlayer insulating layer 400 and the first device isolation layer 150 are formed of a silicon oxide layer, and the first active region AR1a is formed of silicon, the trench may be formed by using an etch process having a higher etch selectivity with respect to the silicon oxide layer than to silicon. In this case, the first interlayer insulating layer 400 overlapping the first active region AR1a is etched while the first active region AR1a may remain unetched. Accordingly, the trench may be formed such that the side surface and the top surface of the first active region AR1a are exposed.

As a result, the image sensor according to some exemplary embodiments of the inventive concepts such as shown and described with respect to FIGS. 6A and 6B can be provided with improved performance by using the side connection contact 402b overlapping with the first device isolation layer 150.

In addition, by connecting the side connection contact 402b with the side and upper surfaces of the first active region AR1a, the area in which the side connection contact 402b comes in contact with the first active region AR1a can be increased. As a result, the contact resistance between the side connection contact 402b and the first active region AR1a can be improved.

In addition, by forming the side connection contact 402b so that it overlaps with the upper surface of the first active region AR1a, it is possible to prevent misalignment of the side connection contact 402b with the first active region AR1a, thus ensuring electrical connection between the side connection contact 402b and the first active region AR1a.

As a result, the image sensor according to some exemplary embodiments of the inventive concepts can provide an image sensor with improved performance by using the side connection contact 402b overlapping with the first device isolation layer 150 and the first active region AR1a.

Hereinafter, an image sensor according to some exemplary embodiments of the inventive concepts will be described with reference to FIGS. 1 to 7B. Redundant descriptions of identical functions and elements described above with reference to FIGS. 1 to 6B will be omitted for convenience of illustration.

Figure 7A:
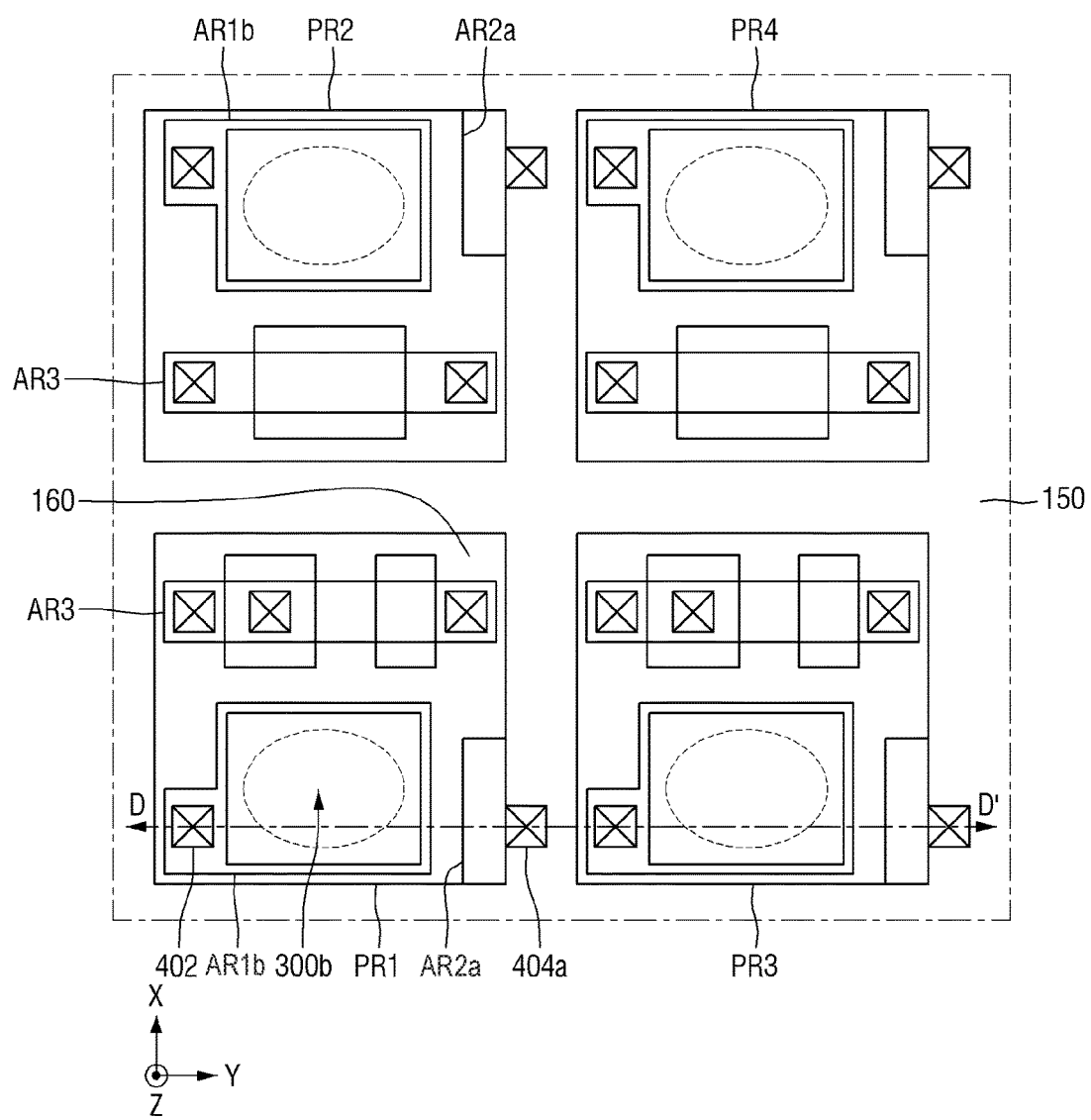
FIG. 7A illustrates a plan view of an image sensor according to exemplary embodiments of the inventive concepts.
Figure 7B:
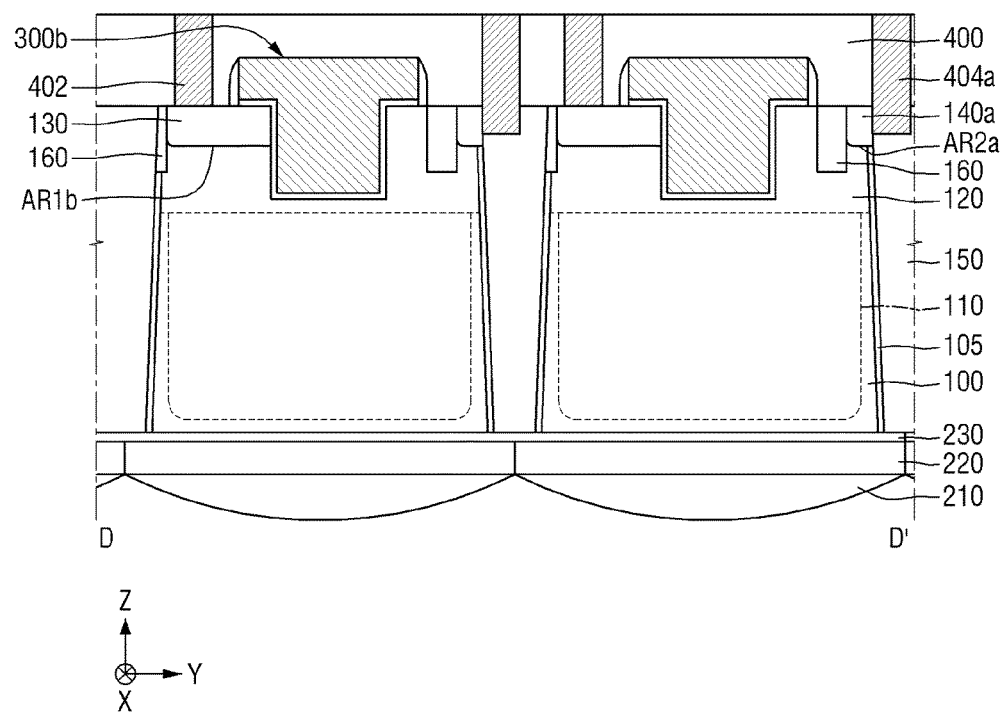
FIG. 7B illustrates a cross-sectional view taken along line D-D' of FIG. 7A.

FIG. 7A illustrates a plan view of an image sensor according to some exemplary embodiments of the inventive concepts. FIG. 7B illustrates a cross-sectional view taken along line D-D' of FIG. 7A.

Referring to FIGS. 4A, 4B, 7A and 7B, an image sensor according to some exemplary embodiments of the inventive concepts includes a side connection contact 404a. The side connection contact 404a of FIGS. 7A and 7B is a counterpart corresponding to the ground region contact 404 of FIGS. 4A and 4B. In addition, a first active region AR1b, a second active region AR2a, a transfer gate 300b and a ground region 140a are counterparts respectively corresponding to the first active region AR1a, the second active region AR2, the transfer gate 300a and the ground region 140.

The side connection contact 404a in FIGS. 7A and 7B, unlike the ground region contact 404 in FIGS. 4A and 4B, overlaps with the first device isolation layer 150 and may be connected to the side surface of the second active region AR2a. That is, the side connection contact 404a may penetrate through a part of the first interlayer insulating layer 400 and the first device isolation layer 150 so as to be connected to the side surface of the second active region AR2a. Accordingly, the lower surface of the side connection contact 404a may be lower than the upper surface of the first device isolation layer 150 and the upper surface of the second active region AR2a, and the upper surface of the side connection contact 404a may higher than the upper surface of the first device isolation layer 150 and the upper surface of the second active region AR2a.

Specifically, the side connection contact 404a may be formed by patterning the first interlayer insulating layer 400 and the first device isolation layer 150 to form a trench such that the side surface of the second active region AR2a is exposed, and filling the trench with a conductive material. Accordingly, the side connection contact 404a may be extend from the upper surface of the first interlayer insulating layer 400 in the third direction Z to be connected to the side surface of the second active region AR2a.

In some embodiments of the inventive concepts, the side connection contact 404a overlaps with the first device isolation layer 150, and may be connected to the side surface of the ground region 140a disposed adjacent to the first device isolation layer 150 in the second active region AR2a. That is, the side connection contact 404a may be electrically connected to the ground region 140a to deliver or connect ground voltage to the pixel regions.

Since the side connection contact 404a in FIGS. 7A and 7B overlaps with the first device isolation layer 150, the transfer gate 300b formed adjacent to the side connection contact 404a may be larger than the transfer gate 300 formed adjacent to the ground region contact 404.

Accordingly, the size of the transfer gate of the image sensor according to some exemplary embodiments of the inventive concepts is increased by using the side connection contact 404a overlapping with the first device isolation layer 150, to thereby address problems such as image lag.

In addition, the side connection contact 404a as shown in FIGS. 7A and 7B provides wider space in the pixel region than the floating ground region contact 404 such as shown in FIGS. 4A and 4B.

As a result, the image sensor according to some exemplary embodiments of the inventive concepts provides an image sensor with improved performance by using the side connection contact 404a overlapping with the first device isolation layer 150.

Hereinafter, an image sensor according to some exemplary embodiments of the inventive concepts will be described with reference to FIGS. 1 to 8B. Redundant descriptions of identical functions and elements described above with reference to FIGS. 1 to 7B will be omitted for convenience of illustration.

Figure 8A:
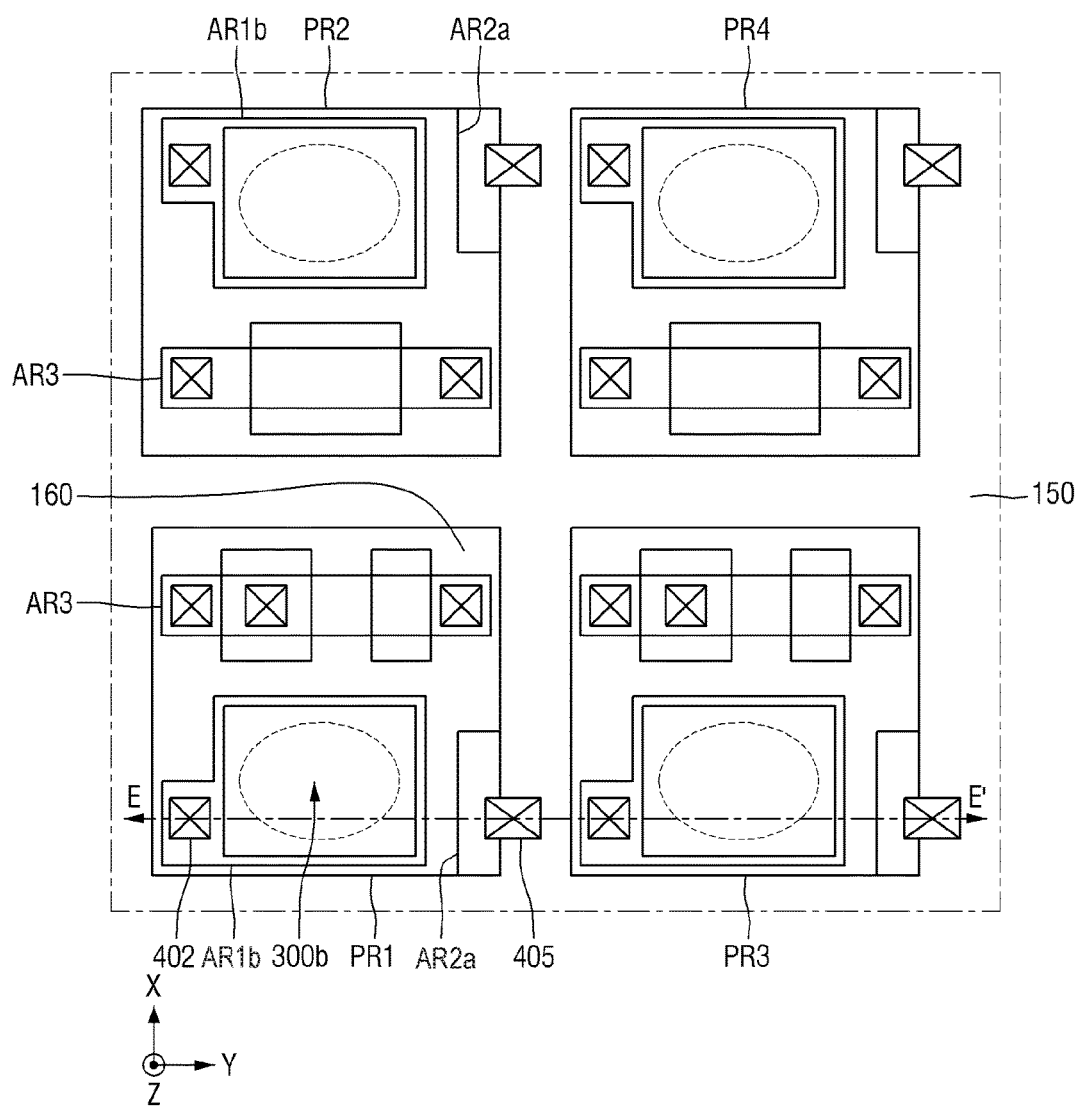
FIG. 8A illustrates a plan view of an image sensor according to exemplary embodiments of the inventive concepts.
Figure 8B:
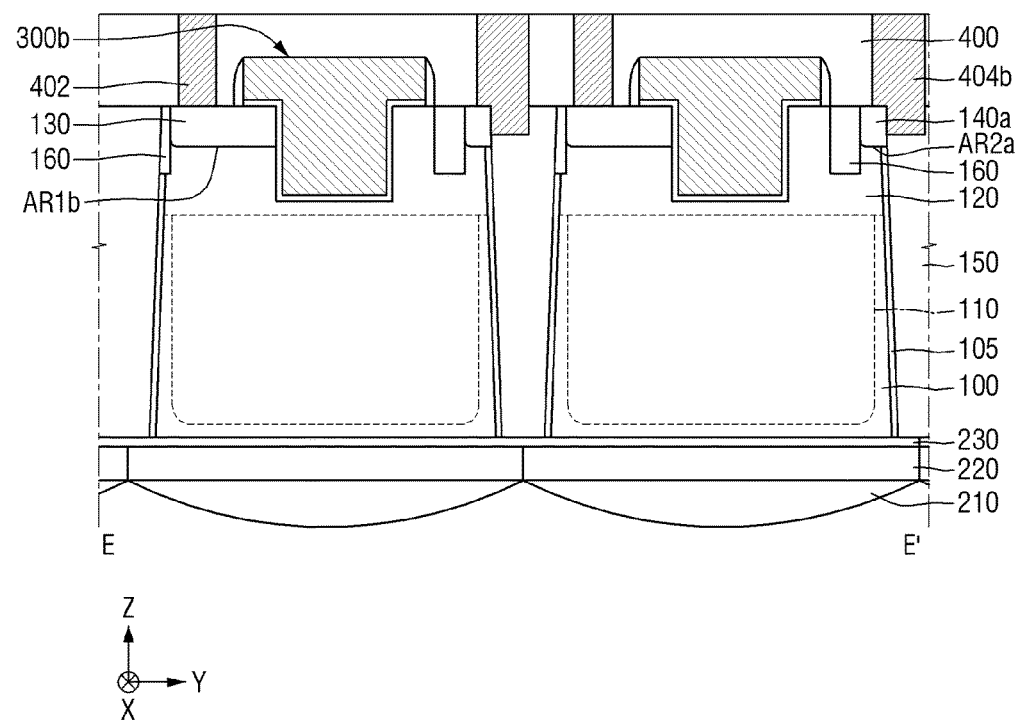
FIG. 8B illustrates a cross-sectional view taken along line E-E' of FIG. 8B.

FIG. 8A illustrates a plan view of an image sensor according to some exemplary embodiments of the inventive concepts. FIG. 8B illustrates a cross-sectional view taken along line E-E' of FIG. 8B.

Referring to FIGS. 7A, 7B, 8A and 8B, an image sensor according to some exemplary embodiments of the inventive concepts includes a side connection contact 404b. The side connection contact 404b of FIGS. 7A and 7B is a counterpart corresponding to the side connection contact 404a of FIGS. 8A and 8B.

The side connection contact 404b overlaps with the first device isolation layer 150 and may be connected to the side surface of the second active region AR2a. The side connection contact 404b also overlaps with the second active region AR2a and may also be connected to the upper surface of the second active region AR2a.

Specifically, the side connection contact 404b may be formed by patterning the first interlayer insulating layer 400 and the first device isolation layer 150 to form a trench such that the side surface and the upper surface of the second active region AR2a are exposed, and filling the trench with a conductive material.

More specifically, the trenches may be formed by using an etch process having a higher etch selectivity with respect to the first device isolation layer 150 than to the second active region AR2a. For example, when the first interlayer insulating layer 400 and the first device isolation layer 150 are formed of a silicon oxide layer and the second active region AR2a is formed of silicon, the trench may be formed by using an etch process having a higher etch selectivity with respect to the silicon oxide layer than to silicon. In this case, the first interlayer insulating layer 400 overlapping with the second active region AR2a is etched while the second active region AR2a may remain unetched.

By connecting the side connection contact 404b with the side and upper surfaces of the second active region AR2a, the area in which the side connection contact 404b comes in contact with the second active region AR2a can be increased. In addition, by forming the side connection contact 404b so that it overlaps with the upper surface of the second active region AR2a, it is possible to prevent misalignment of the side connection contact 404b with the second active region AR2a, thus ensuring that the side connection contact 404b and the second active region AR2a are electrically connected to each other.

As a result, the image sensor according to some exemplary embodiments of the inventive concepts is provided with improved performance by using the side connection contact 404b overlapping with the first device isolation layer 150 and the second active region AR2a.

Hereinafter, an image sensor according to some exemplary embodiments of the inventive concepts will be described with reference to FIGS. 1 to 9B. Redundant descriptions of identical functions and elements described above with reference to FIGS. 1 to 8B will be omitted for convenience of illustration.

Figure 9A:
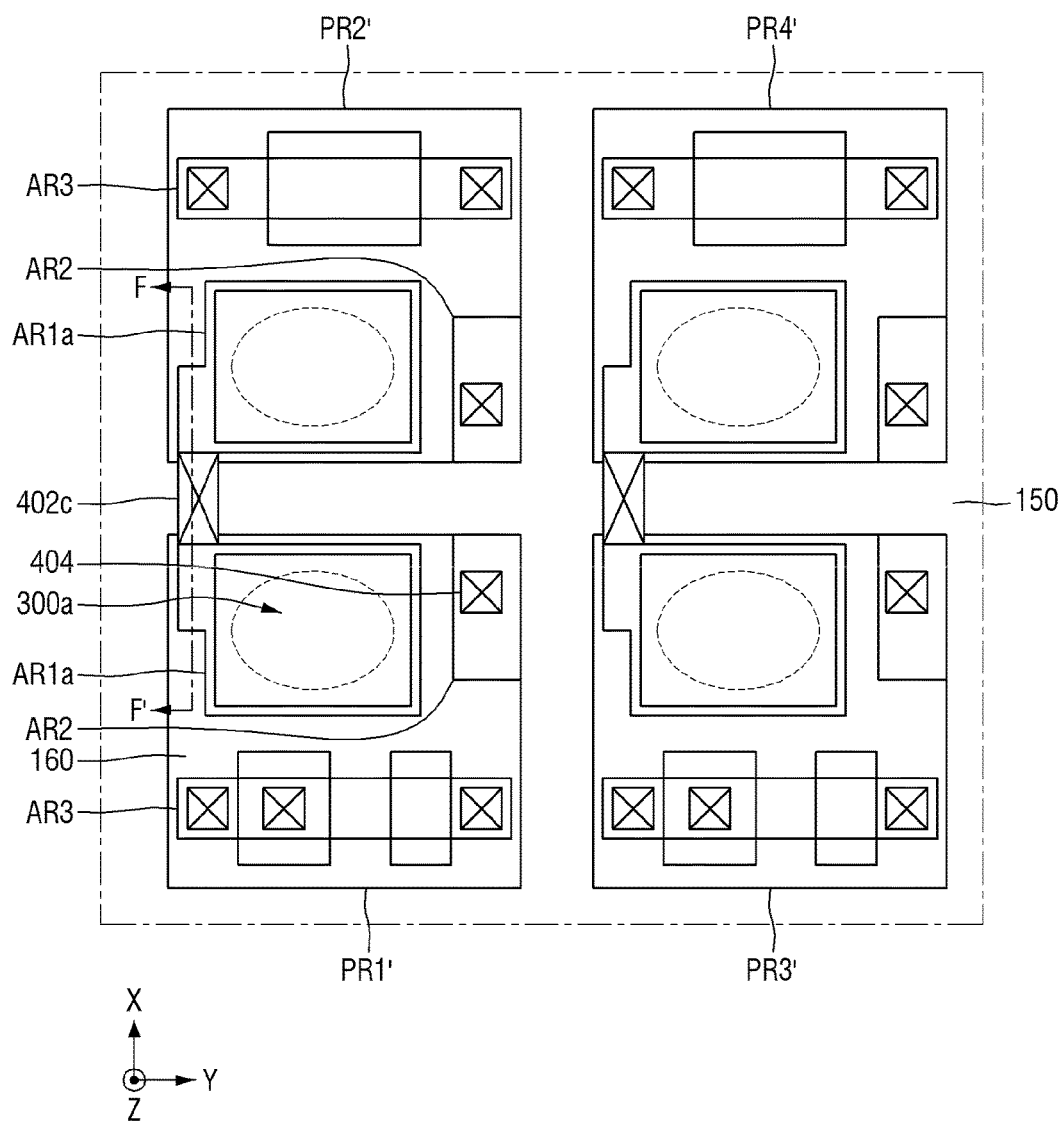
FIG. 9A illustrates a plan view of an image sensor according to exemplary embodiments of the inventive concepts.
Figure 9B:
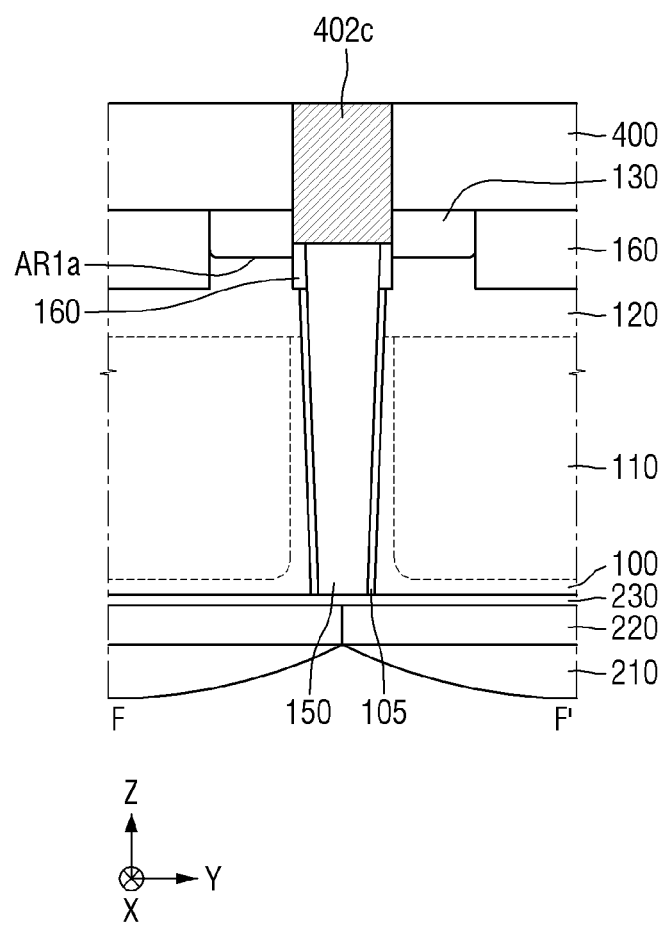
FIG. 9B illustrates a cross-sectional view taken along line F-F' of FIG. 9A.

FIG. 9A illustrates a plan view of an image sensor according to some exemplary embodiments of the inventive concepts. FIG. 9B is a cross-sectional view taken along line F-F' of FIG. 9A.

Referring to FIGS. 4A, 4B, 9A and 9B, an image sensor according to some exemplary embodiments of the inventive concepts includes a first side connection contact 402c (which may hereinafter be referred to generally as a side connection contact 402c). The first side connection contact 402c in FIGS. 9A and 9B is a counterpart corresponding to the side connection contact 402a of FIGS. 4A and 4B. In addition, first to fourth pixel regions PR1', PR2', PR3' and PR4' may have a shape in which the first to fourth pixel regions PR1, PR2, PR3 and PR4 are horizontally symmetric when viewed from the top.

The first side connection contact 402c overlaps with the first device isolation layer 150 and may be connected to the side surface of the first active region AR1a. The first side connection contact 402c may be connected to both the side surface of the first active region AR1a of the first pixel region PR1' and the side surface of the first active region AR1a of the second pixel region PR2'.

Specifically, the first side connection contact 402c may be formed by patterning the first interlayer insulating layer 400 and the first device isolation layer 150 to form a trench such that a side surface of the first active region AR1a of the first pixel region PR1' and a side surface of the first active region AR1a of the second pixel region PR2' are exposed, and filling the trench with a conductive material. By doing so, the first side connection contact 402c extends in the third direction Z from the upper surface of the first interlayer insulating layer 400 and may be connected to both of the side surface of the first active region AR1a of the first pixel region PR1' and the side surface of the first active region AR1a of the second pixel region PR2'. That is, the first and second pixel regions PR1' and PR2' may share the first side connection contact 402c, and the third and fourth pixel regions PR3' and PR4' may likewise share a first side connection contact 402c.

By sharing the first side connection contact 402c, it becomes easier to form a shared pixel. For example, when the first side connection contact 402c is shared, two floating diffusion regions may be connected to the reset transistor and/or another logic transistor via the single first side connection contact 402c. In addition, by sharing the first side connection contact 402c, it is possible to provide wider space in the pixel regions.

In addition, by disposing the first side connection contact 402c so that it overlaps with the first device isolation layer 150, it is possible to improve the conversion gain and the signal-to-noise ratio of the image sensor by reducing the area of the floating diffusion region. In addition, by disposing the first side connection contact 402c so that it overlaps with the first device isolation layer 150, it is possible to improve problems such as image lag by increasing the size of the transfer gate.

Consequently, the image sensor according to some exemplary embodiments of the inventive concepts provides improved performance by using the first side connection contact 402c that overlaps with the first device isolation layer 150 and is shared by the pixel regions.

Hereinafter, an image sensor according to some exemplary embodiments of the inventive concepts will be described with reference to FIGS. 1 to 10B. Redundant descriptions of identical functions and elements described above with reference to FIGS. 1 to 9B will be omitted for convenience of illustration.

Figure 10A:
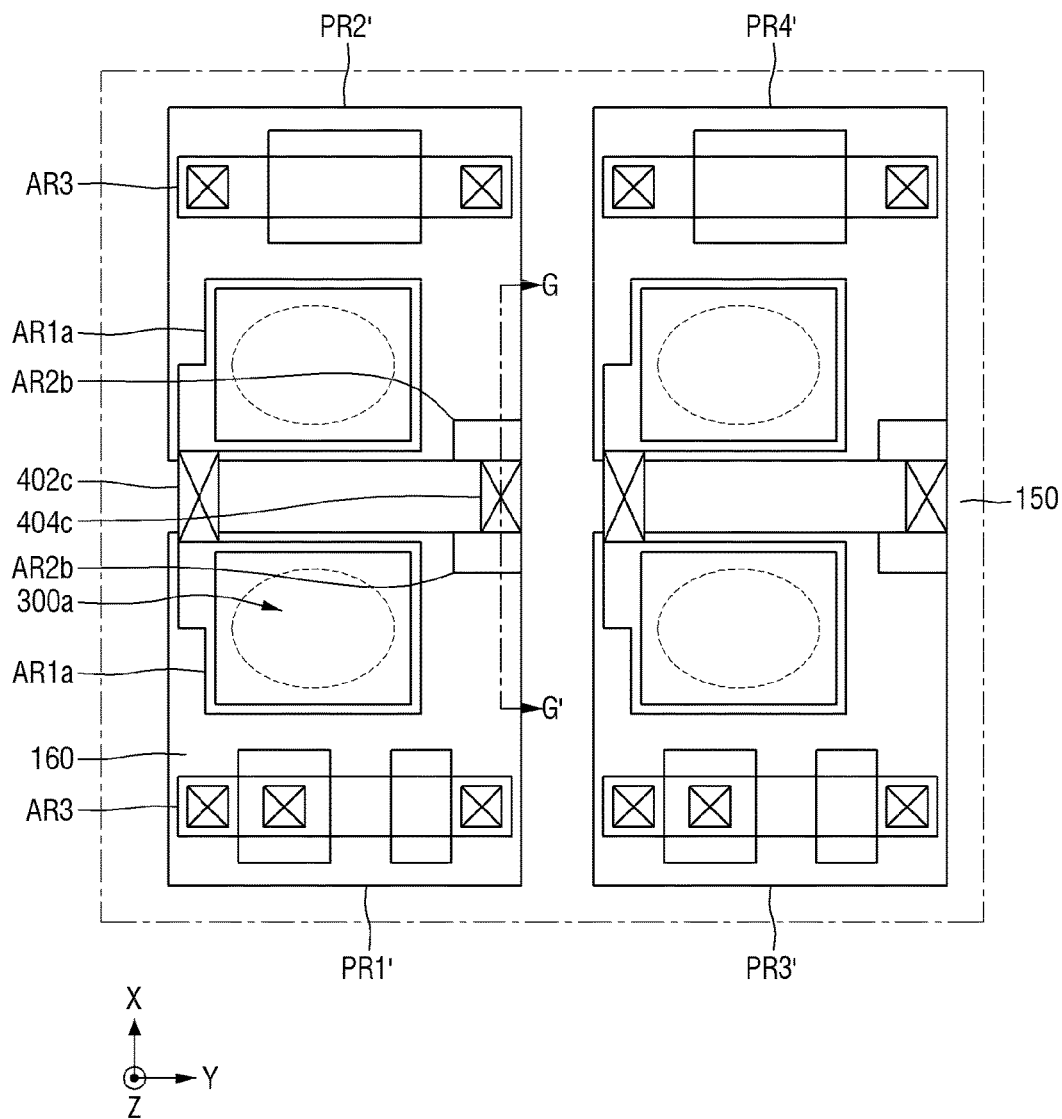
FIG. 10A illustrates a plan view of an image sensor according to exemplary embodiments of the inventive concepts.
Figure 10B:
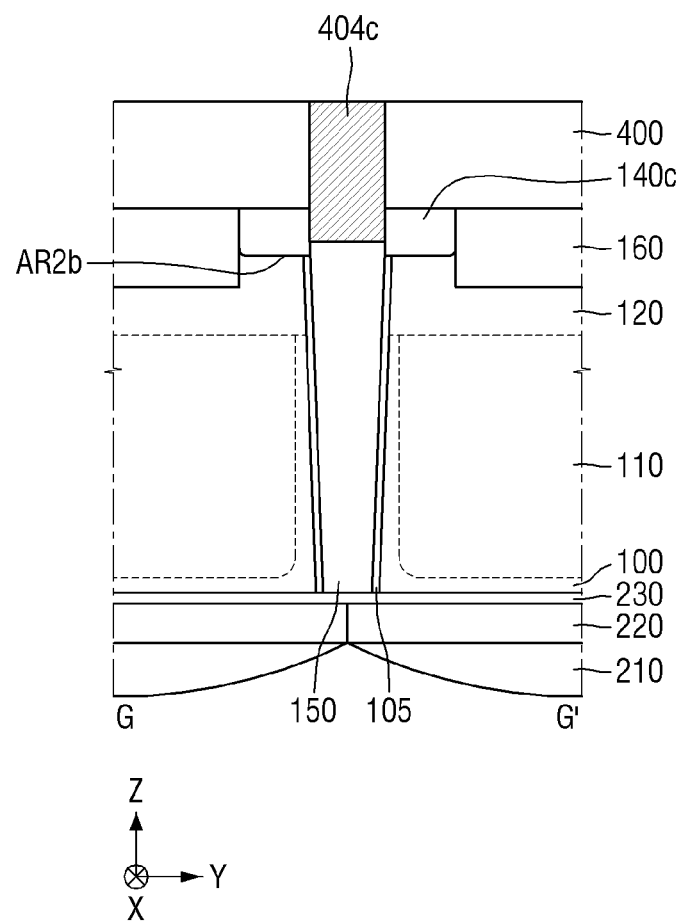
FIG. 10B illustrates a cross-sectional view taken along line G-G' of FIG. 10B.

FIG. 10A illustrates a plan view of an image sensor according to some exemplary embodiments of the inventive concepts. FIG. 10B illustrates a cross-sectional view taken along line G-G' of FIG. 10B.

Referring to FIGS. 9A, 9B, 10A and 10B, an image sensor according to some exemplary embodiments of the inventive concepts includes side connection contacts 402c and 404c. The side connection contact 404c is the counterpart of the ground region contact 404. In addition, a second active region AR2b is the counterpart of the second active region AR2.

The side connection contact 404c overlaps with the first device isolation layer 150 and may be connected to the side surface of the second active region AR2b. The side connection contact 404c may be connected to both the side surface of the second active region AR2b of the first pixel region PR1' and the side surface of the second active region AR2b of the second pixel region PR2'.

Specifically, the side connection contact 404c may be formed by patterning the first interlayer insulating layer 400 and the first device isolation layer 150 to form a trench such that the side surface of the second active region AR2b of the first pixel region PR1' and the side surface of the second active region AR2b of the second pixel region PR2' are exposed, and filling the trench with a conductive material. By doing so, the side connection contact 404c extends in the third direction Z from the upper surface of the first interlayer insulating layer 400 and may be connected to both the side surface of the second active region AR2b of the first pixel region PR1' and the side surface of the second active region AR2b of the second pixel region PR2'. That is, the first and second pixel regions PR1' and PR2' may share the side connection contact 404c, and the third and fourth pixel regions PR3' and PR4' may likewise share the side connection contact 404c.

By sharing the side connection contact 404c, it becomes easier to form a shared pixel. For example, when the side connection contact 404c is shared, the ground voltage may be provided or connected to two ground regions via the single side connection contact 404c.

In addition, by sharing the side connection contact 404c, it is possible to provide wider space in the pixel regions. For example, as shown in FIGS. 10A and 10B, the second active region AR2b may be smaller than the second active region AR2 shown in FIGS. 9A and 9B in both the first and second directions X and Y.

In addition, by disposing the side connection contact 404c so that it overlaps with the first device isolation layer 150, it is possible to improve problems such as image lag by increasing the size of the transfer gate.

Consequently, the image sensor according to some exemplary embodiments of the inventive concepts provides improved performance by using the side connection contact 404c that overlaps with the first device isolation layer 150 and is shared by the pixel regions.

Hereinafter, an image sensor according to some exemplary embodiments of the inventive concepts will be described with reference to FIGS. 1 to 11B. Redundant descriptions of identical functions and elements described above with reference to FIGS. 1 to 10B will be omitted for convenience of illustration.

Figure 11A:
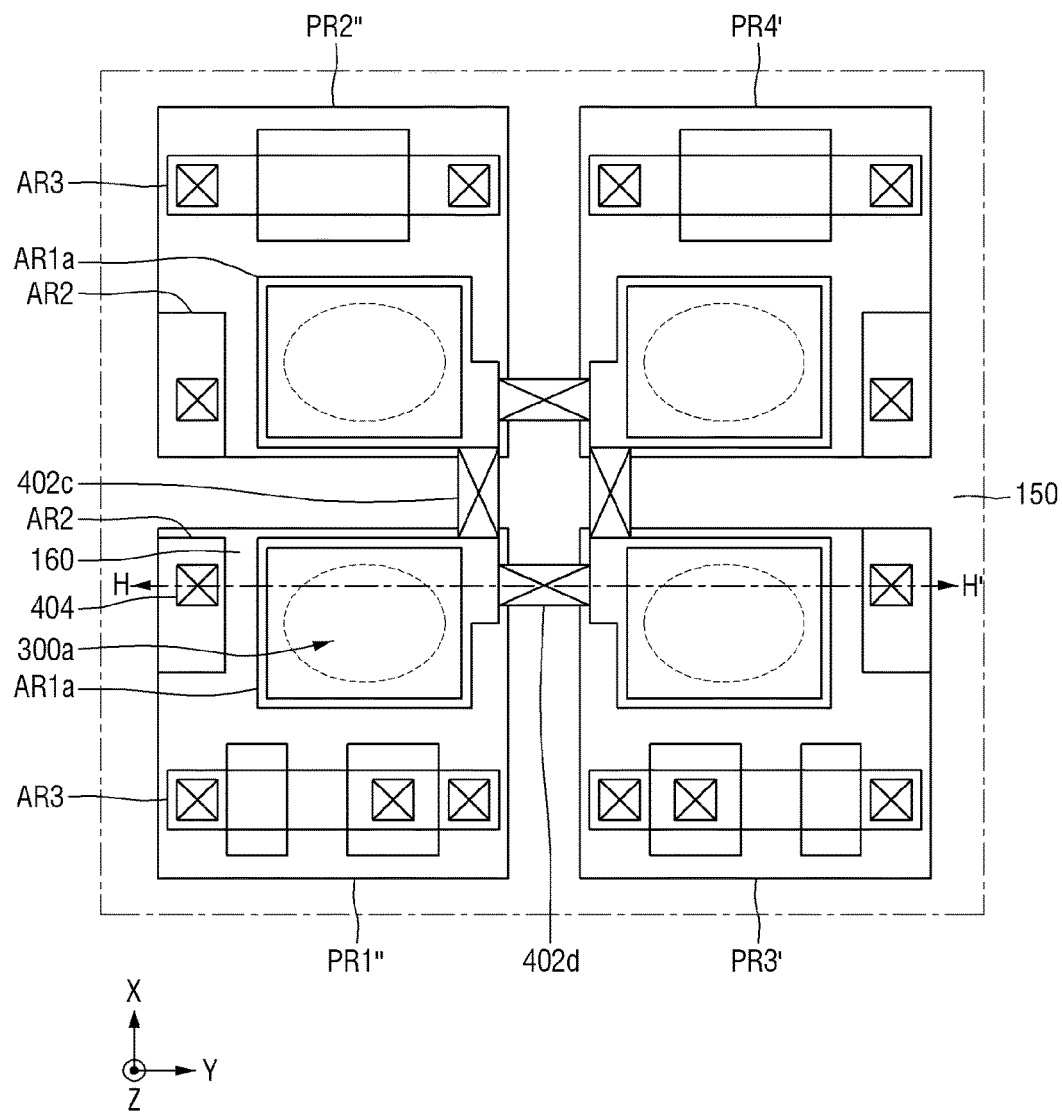
FIG. 11A illustrates a plan view of an image sensor according to exemplary embodiments of the inventive concepts.
Figure 11B:
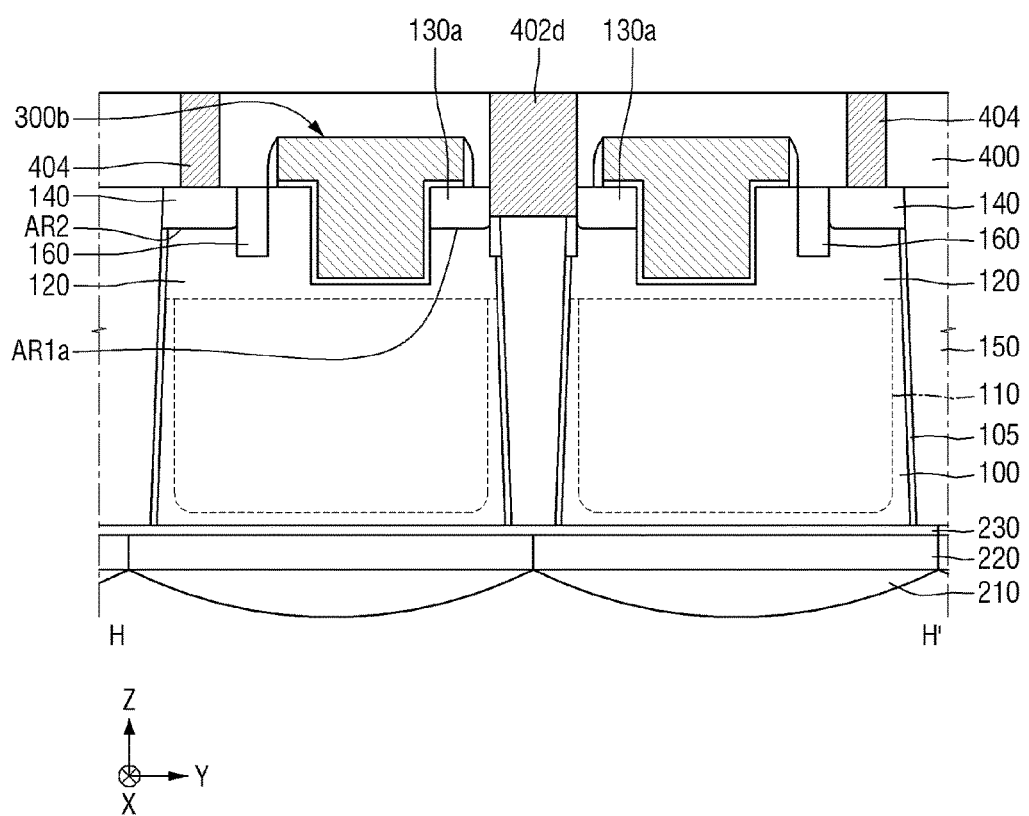
FIG. 11B illustrates a cross-sectional view taken along line H-H' of FIG. 4A.

FIG. 11A illustrates a plan view of an image sensor according to some exemplary embodiments of the inventive concepts. FIG. 11B illustrates a cross-sectional view taken along line H-H' of FIG. 4A.

Referring to FIGS. 9A, 9B, 11A and 11B, an image sensor according to some exemplary embodiments of the inventive concepts includes first and second side connection contacts 402c and 402d. The first and second pixel regions PR1" and PR2" may have a shape in which the first and second pixel regions PR1' and PR2' are vertically symmetric when viewed from the top.

The second side connection contact 402d (which may hereinafter be generally referred to as side connection contact 402d) overlaps with the first device isolation layer 150 and may be connected to the side surface of the first active region AR1a. The second side connection contact 402d may be connected to both the side surface of the first active region AR1a of the first pixel region PR1" and the side surface of the first active region AR1a of the third pixel region PR3'.

Specifically, the second side connection contact 402d may be formed by patterning the first interlayer insulating layer 400 and the first device isolation layer 150 to form a trench such that a side surface of the first active region AR1a of the first pixel region PR1" and a side surface of the first active region AR1a of the third pixel region PR3' are exposed, and filling the trench with a conductive material. That is, the second side connection contact 420d may be formed in the same manner as the first side connection contact 402c, and possibly simultaneously. Accordingly, the first to fourth pixel regions PR1", PR2", PR3' and PR4' may share the side connection contacts 402c and 402d.

By sharing the first and second side connection contacts 402c and 402d, it becomes easier to form a shared pixel. For example, when the side connection contacts 402c and 402d are shared, four floating diffusion regions may be connected to the reset transistor and/or another logic transistor via a single line connected to the side connection contacts 402c and 402d. In addition, by sharing the first side connection contact 402c, it is possible to provide wider space in the pixel regions.

In addition, by disposing the side connection contacts 402c and 402d so that they overlap with the first device isolation layer 150, it is possible to improve the conversion gain and the signal-to-noise ratio of the image sensor by reducing the area of the floating diffusion region. In addition, by disposing the side connection contacts 402c and 402d so that they overlap with the first device isolation layer 150, it is possible to improve problems such as image lag by increasing the size of the transfer gate.

Consequently, the image sensor according to some exemplary embodiments of the inventive concepts provides improved performance by using the side connection contacts 402c and 402d that overlap with the first device isolation layer 150 and are shared by the pixel regions.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive.

What is claimed is:

1. An image sensor comprising:
   first and second pixel regions disposed adjacent to each other along a first direction in a light-receiving region, wherein the light-receiving region receives light and generates charges;
   a third pixel region disposed adjacent to the first pixel region along a second direction in the light-receiving region, the second direction intersecting the first direction;
   a first device isolation layer disposed between the first and second pixel regions and between the first and third pixel regions to separate the first pixel region from the second pixel region and the first pixel region from the third pixel region;
   second device isolation layers disposed in each of the first to third pixel regions to define active regions in each of the first to third pixel regions;
   a plurality of transfer gates and a plurality of logic gates disposed on the active regions; and
   a side connection contact overlapping the first device isolation layer and connected to a side surface of an active region from among the active regions.

2. The image sensor of claim 1, wherein the side connection contact overlaps the active region and is connected to the side surface and an upper surface of the active region.

3. The image sensor of claim 1, wherein the active region includes a floating diffusion region and a ground region, and
   wherein the side connection contact is connected to the floating diffusion region or the ground region.

4. The image sensor of claim 1, wherein a transfer gate from among the plurality of transfer gates extends in a third direction that intersects the first and second directions, and wherein a lowest surface of the transfer gate is lower than a lower surface of the active region.

5. The image sensor of claim 1, wherein the side connection contact is connected to both an active region from among the active regions that is in the first pixel region and an active region from among the active regions that is in the second pixel region.

6. The image sensor of claim 5, wherein the active regions in the first and second pixel regions include a floating diffusion region, and
   wherein the side connection contact is connected to both the floating diffusion region in the first pixel region and the floating diffusion region in the second pixel region.

7. The image sensor of claim 5, wherein the active regions in the first and second pixel regions include a ground region, and
   wherein the side connection contact is connected to both the ground region in the first pixel region and the ground region in the second pixel region.

8. The image sensor of claim 1, wherein the side connection contact comprises:
   a first side connection contact connected to both an active region from among the active regions that is in the first pixel region and an active region from among the active regions that is in the second pixel region; and
   a second side connection contact connected to both another active region from among the active regions that is in the first pixel region and an active region from among the active regions that is in the third pixel region.

9. The image sensor of claim 8, wherein the active regions in the first, second and third pixel regions include a floating diffusion region,
   wherein the first side connection contact is connected to both the floating diffusion region in the first pixel region and the floating diffusion region in the second pixel region; and
   the second side connection contact is connected to both the floating diffusion region in the first pixel region and the floating diffusion region in the third pixel region.

10. The image sensor of claim 1, wherein logic gates from among the plurality of logic gates disposed on an active region from among the active regions that is in the first pixel region include a source follower gate and a selection gate, and
    wherein a logic gate from among the plurality of logic gates disposed in an active region from among the active regions that is in the second pixel region includes a reset gate.

11. An image sensor comprising:
    a pixel region disposed in a light-receiving region and defined by a first device isolation layer, wherein the light-receiving region receives light and generates charges;
    a photoelectric conversion layer disposed in the pixel region;
    a well impurity layer disposed on the photoelectric conversion layer;
    a second device isolation layer defining active regions in the well impurity layer, wherein the active regions include a first active region and a second active region;
    a transfer gate disposed over the photoelectric conversion layer and adjacent to the first active region; and
    a side connection contact overlapping the first device isolation layer and connected to a side surface of the first active region or a side surface of the second active region.

12. The image sensor of claim 11, wherein the side connection contact overlaps the first active region and is connected to the side surface of the first active region and an upper surface of the first active region, or overlaps the second active region and is connected to the side surface of the second active region and an upper surface of the second active region.

13. The image sensor of claim 11, wherein the first active region includes a floating diffusion region disposed on a side of the transfer gate,
wherein the second active region includes a ground region disposed on an other side of the transfer gate, and
wherein the side connection contact is connected to the floating diffusion region or the ground region.

14. The image sensor of claim 11, wherein the active regions further include a third active region, and
wherein the image sensor further comprises a plurality of logic gates disposed in the third active region.

15. The image sensor of claim 11, wherein the transfer gate is disposed in the well impurity layer and extends toward the photoelectric conversion layer, and
wherein a lowest surface of the transfer gate is lower than a lower surface of the first and second active regions.

16. An image sensor comprising:
a first pixel region having a first photoelectric conversion region disposed therein;
a first device isolation layer surrounding the first pixel region;
a second device isolation layer defining active regions in the first pixel region; and
a first side connection contact that overlaps the first device isolation layer, that extends through a part of the first device isolation layer, and that is connected to a side surface of a first active region from among the active regions.

17. The image sensor of claim 16, comprising a second side connection contact that overlaps the first device isolation layer, that extends through another part of the first device isolation layer, and that is connected to a side surface of a second active region from among the active regions.

18. The image sensor of claim 17, wherein the first active region comprises a floating diffusion region and the second active region comprises a ground region.

19. The image sensor of claim 16, wherein the first side connection contact is also connected to an upper surface of the first active region.

20. The image sensor of claim 16, further comprising:
a second pixel region having a second photoelectric conversion region disposed therein,
the first device isolation layer surrounding the second pixel region; and
another second device isolation layer defining active regions in the second pixel region,
wherein the first side connection contact extends through another part of the first device isolation layer and is connected to a side surface of a second active region from among the active regions that is in the second pixel region.

* * * * *